United States Patent
Nakabayashi et al.

(10) Patent No.: US 9,335,148 B2
(45) Date of Patent: May 10, 2016

(54) TOUCH PANEL SYSTEM, AND CAPACITANCE VALUE DISTRIBUTION DETECTING DEVICE HAVING NOISE DETERMINING SECTION

(71) Applicant: SHARP KABUSHIKI KAISHA, Osaka-shi, Osaka (JP)

(72) Inventors: Tamiyo Nakabayashi, Osaka (JP); Masayuki Miyamoto, Osaka (JP); Mutsumi Hamaguchi, Osaka (JP); Hiroshi Kuhara, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/420,975

(22) PCT Filed: Sep. 9, 2013

(86) PCT No.: PCT/JP2013/074278
§ 371 (c)(1),
(2) Date: Feb. 11, 2015

(87) PCT Pub. No.: WO2014/042128
PCT Pub. Date: Mar. 20, 2014

(65) Prior Publication Data
US 2015/0184991 A1 Jul. 2, 2015

(30) Foreign Application Priority Data
Sep. 11, 2012 (JP) .................................. 2012-199994

(51) Int. Cl.
*G06F 3/041* (2006.01)
*G01B 7/00* (2006.01)
(Continued)

(52) U.S. Cl.
CPC ............ *G01B 7/003* (2013.01); *G01R 27/2605* (2013.01); *G06F 3/044* (2013.01); *G06F 3/0418* (2013.01); *G01B 2210/58* (2013.01); *G01D 5/24* (2013.01)

(58) Field of Classification Search
CPC ....................................................... G06F 3/044
USPC ......................................................... 345/173
See application file for complete search history.

(56) References Cited

U.S. PATENT DOCUMENTS

2006/0214921 A1 9/2006 Takahashi et al.
2010/0328256 A1 12/2010 Harada et al.
(Continued)

FOREIGN PATENT DOCUMENTS

JP 2006-268288 A 10/2006
JP 2011-8726 A 1/2011
(Continued)

*Primary Examiner* — Long D Pham
(74) *Attorney, Agent, or Firm* — Birch, Stewart, Kolasch & Birch, LLP

(57) ABSTRACT

Realized is an electrostatic capacitance value distribution detecting device capable of determining whether or not external noise exists. An electrostatic capacitance value distribution detecting circuit (2) of an aspect of the present invention drives vertical signal lines (VL) to output, from horizontal signal lines (HL), electric charges corresponding to electrostatic capacitances, and then drives the horizontal signal lines to output, from the vertical signal lines, electric charges corresponding to the electrostatic capacitances. The electrostatic capacitance value distribution detecting device includes a noise detecting section (8) which determines whether or not external noise exists.

19 Claims, 24 Drawing Sheets

(51) Int. Cl.
 *G06F 3/044* (2006.01)
 *G01R 27/26* (2006.01)
 *G01D 5/24* (2006.01)

(56) References Cited

U.S. PATENT DOCUMENTS

| | | | |
|---|---|---|---|
| 2011/0115729 A1* | 5/2011 | Kremin | G06F 3/0418 345/173 |
| 2011/0148810 A1 | 6/2011 | Kitada et al. | |
| 2011/0234523 A1* | 9/2011 | Chang | G06F 3/044 345/173 |
| 2012/0075220 A1 | 3/2012 | Matsui et al. | |
| 2012/0268415 A1* | 10/2012 | Konovalov | G06F 3/044 345/174 |
| 2013/0063388 A1* | 3/2013 | Ningrat | G06F 3/044 345/174 |
| 2013/0211757 A1 | 8/2013 | Miyamoto | |
| 2013/0285974 A1 | 10/2013 | Nakabayashi et al. | |
| 2013/0307814 A1* | 11/2013 | Chang | G06F 3/0418 345/174 |
| 2013/0307815 A1 | 11/2013 | Chang | |
| 2013/0321330 A1 | 12/2013 | Chang | |
| 2013/0321331 A1 | 12/2013 | Chang | |
| 2014/0139483 A1 | 5/2014 | Miyamoto et al. | |
| 2014/0149059 A1 | 5/2014 | Miyamoto et al. | |
| 2014/0300576 A1 | 10/2014 | Chang | |

FOREIGN PATENT DOCUMENTS

| | | |
|---|---|---|
| JP | 2011-128857 A | 6/2011 |
| JP | 2011-128858 A | 6/2011 |
| JP | 2012-22635 A | 2/2012 |
| JP | 2012-69083 A | 4/2012 |
| JP | 2012-118957 A | 6/2012 |
| JP | 5250135 B1 | 7/2013 |
| TW | 201301111 A | 1/2013 |
| TW | 201349069 A | 12/2013 |

* cited by examiner

FIG. 11

FIRST CONNECTION STATE

| | D0 | D1 | D2 | D3 | D4 | D5 | D6 | D7 | D8 | D9 | D10 | D11 | D12 | D13 | D14 | D15 | D16 | D17 | D18 | D19 | D20 | NoiseIndicator(i) |
|---|---|---|---|---|---|---|---|---|---|---|---|---|---|---|---|---|---|---|---|---|---|---|
| S0 | 6 | 3 | 7 | 12 | 2 | 5 | 7 | 15 | 1 | 7 | 2 | 7 | 9 | 9 | 14 | 2 | 7 | 10 | 1 | 6 | 7 | 0 |
| S1 | 9 | 10 | 10 | 14 | 32 | 3 | 3 | 2 | 31 | 11 | 4 | 9 | 8 | 7 | 10 | 4 | 18 | 14 | 0 | 9 | 1 | 0 |
| S2 | 1 | 13 | 39 | 73 | 15 | 5 | 9 | 64 | 11 | 4 | 8 | 42 | 46 | 31 | 20 | 18 | 5 | 29 | 19 | 18 | 35 | 0 |
| S3 | 3 | 4 | 5 | 25 | 147 | 1010 | 1200 | 75 | 7 | 3 | 5 | 39 | 50 | 41 | 36 | 16 | 8 | 25 | 11 | 23 | 31 | 3 |
| S4 | 6 | 4 | 32 | 730 | 270 | 3000 | 1200 | 67 | 70 | 31 | 11 | 4 | 9 | 5 | 7 | 15 | 36 | 10 | 10 | 14 | 32 | 4 |
| S5 | 5 | 6 | 52 | 9 | 155 | 1000 | 400 | 41 | 15 | 47 | 37 | 14 | 41 | 49 | 62 | 5 | 12 | 43 | 7 | 13 | 11 | 3 |
| S6 | 2 | 10 | 10 | 707 | 350 | 3200 | 900 | 88 | 13 | 3 | 2 | 7 | 13 | 10 | 11 | 5 | 10 | 7 | 0 | 5 | 7 | 4 |
| S7 | 6 | 4 | 62 | 37 | 40 | 50 | 60 | 33 | 32 | 2 | 39 | 40 | 42 | 33 | 5 | 7 | 15 | 46 | 3 | 20 | 21 | 0 |
| S8 | 3 | 7 | 32 | 6 | 17 | 4 | 23 | 52 | 7 | 3 | 5 | 39 | 50 | 41 | 36 | 16 | 8 | 25 | 11 | 23 | 31 | 0 |
| S9 | 14 | 21 | 13 | 10 | 22 | 6 | 9 | 1 | 28 | 4 | 16 | 11 | 4 | 7 | 10 | 16 | 14 | 26 | 10 | 7 | 0 | 0 |
| S10 | 4 | 5 | 2 | 18 | 8 | 61 | 28 | 14 | 7 | 3 | 2 | 7 | 13 | 10 | 11 | 5 | 10 | 7 | 0 | 8 | 4 | 0 |

FIG. 12

SECOND CONNECTION STATE

|  | D0 | D1 | D2 | D3 | D4 | D5 | D6 | D7 | D8 | D9 | D10 | NoiseIndicator(i) |
|---|---|---|---|---|---|---|---|---|---|---|---|---|
| S0 | 0 | 29 | 6 | 7 | 11 | 81 | 7 | 5 | 8 | 19 | 9 | 0 |
| S1 | 8 | 25 | 18 | 6 | 10 | 10 | 4 | 4 | 12 | 26 | 10 | 0 |
| S2 | 12 | 15 | 44 | 28 | 4 | 16 | 11 | 67 | 37 | 18 | 7 | 0 |
| S3 | 17 | 19 | 78 | 30 | 45 | 14 | 4 | 42 | 71 | 15 | 23 | 0 |
| S4 | 7 | 20 | 20 | 152 | 275 | 320 | 89 | 28 | 4 | 16 | 11 | 3 |
| S5 | 4 | 23 | 30 | 1015 | 3005 | 1005 | 1200 | 55 | 18 | 71 | 66 | 4 |
| S6 | 41 | 5 | 23 | 1205 | 2405 | 405 | 1000 | 60 | 21 | 3 | 1 | 4 |
| S7 | 20 | 7 | 69 | 28 | 4 | 16 | 11 | 38 | 57 | 6 | 19 | 0 |
| S8 | 6 | 36 | 16 | 27 | 12 | 28 | 4 | 16 | 11 | 33 | 12 | 0 |
| S9 | 12 | 16 | 9 | 6 | 1 | 52 | 3 | 5 | 8 | 9 | 8 | 0 |
| S10 | 7 | 9 | 13 | 61 | 25 | 42 | 34 | 44 | 10 | 21 | 7 | 0 |
| S11 | 12 | 14 | 47 | 67 | 4 | 19 | 4 | 45 | 44 | 16 | 12 | 0 |
| S12 | 14 | 13 | 51 | 91 | 5 | 46 | 2 | 47 | 55 | 9 | 18 | 0 |
| S13 | 14 | 12 | 28 | 4 | 16 | 11 | 10 | 38 | 46 | 12 | 15 | 0 |
| S14 | 19 | 15 | 42 | 4 | 10 | 67 | 3 | 2 | 41 | 15 | 16 | 0 |
| S15 | 7 | 27 | 23 | 10 | 10 | 5 | 5 | 8 | 21 | 21 | 10 | 0 |
| S16 | 12 | 23 | 10 | 10 | 41 | 10 | 37 | 5 | 13 | 19 | 15 | 0 |
| S17 | 15 | 19 | 34 | 65 | 10 | 48 | 5 | 51 | 30 | 31 | 12 | 0 |
| S18 | 6 | 5 | 24 | 18 | 10 | 12 | 10 | 8 | 16 | 15 | 0 | 0 |
| S19 | 11 | 14 | 23 | 12 | 20 | 18 | 40 | 25 | 28 | 12 | 13 | 0 |
| S20 | 12 | 6 | 40 | 36 | 40 | 16 | 30 | 26 | 36 | 0 | 9 | 0 |

FIG. 13

FIRST CONNECTION STATE

| | D0 | D1 | D2 | D3 | D4 | D5 | D6 | D7 | D8 | D9 | D10 | D11 | D12 | D13 | D14 | D15 | D16 | D17 | D18 | D19 | D20 | NoiseIndicator(i) |
|---|---|---|---|---|---|---|---|---|---|---|---|---|---|---|---|---|---|---|---|---|---|---|
| S0 | 1 | 3 | 7 | 12 | 2 | 53 | 36 | 15 | 1 | 7 | 2 | 7 | 9 | 9 | 14 | 2 | 7 | 10 | 1 | 6 | 7 | 0 |
| S1 | 24 | 20 | 10 | 14 | 32 | 101 | 121 | 2 | 31 | 11 | 4 | 9 | 8 | 7 | 10 | 22 | 18 | 14 | 0 | 9 | 1 | 2 |
| S2 | 1 | 13 | 39 | 73 | 15 | 349 | 252 | 64 | 11 | 4 | 8 | 42 | 46 | 54 | 37 | 18 | 5 | 29 | 19 | 18 | 35 | 2 |
| S3 | 165 | 157 | 110 | 25 | 147 | 1010 | 1200 | 75 | 122 | 101 | 56 | 62 | 86 | 51 | 116 | 99 | 185 | 60 | 13 | 7 | 31 | 10 |
| S4 | 6 | 96 | 440 | 730 | 270 | 3300 | 2400 | 529 | 124 | 96 | 20 | 436 | 575 | 510 | 374 | 180 | 36 | 288 | 258 | 161 | 362 | 16 |
| S5 | 76 | 102 | 52 | 9 | 155 | 1000 | 400 | 300 | 200 | 150 | 37 | 14 | 41 | 49 | 62 | 80 | 102 | 43 | 7 | 13 | 11 | 8 |
| S6 | 2 | 109 | 434 | 707 | 350 | 3600 | 2700 | 415 | 131 | 92 | 29 | 432 | 560 | 500 | 350 | 186 | 32 | 270 | 266 | 141 | 375 | 17 |
| S7 | 105 | 109 | 62 | 37 | 127 | 550 | 600 | 33 | 82 | 66 | 39 | 40 | 42 | 33 | 69 | 75 | 107 | 46 | 3 | 20 | 21 | 6 |
| S8 | 3 | 7 | 32 | 66 | 17 | 300 | 213 | 52 | 7 | 3 | 5 | 39 | 50 | 41 | 36 | 16 | 8 | 25 | 11 | 23 | 31 | 2 |
| S9 | 14 | 21 | 13 | 10 | 22 | 66 | 95 | 1 | 28 | 4 | 16 | 11 | 4 | 7 | 10 | 16 | 14 | 26 | 10 | 7 | 0 | 0 |
| S10 | 4 | 5 | 2 | 18 | 8 | 61 | 28 | 14 | 7 | 3 | 2 | 7 | 13 | 10 | 11 | 5 | 10 | 7 | 0 | 8 | 4 | 0 |

FIG. 14

SECOND CONNECTION STATE

|     | D0 | D1  | D2  | D3   | D4   | D5   | D6   | D7  | D8  | D9  | D10 | NoiseIndicator(i) |
|-----|-----|-----|-----|------|------|------|------|-----|-----|-----|-----|-------------------|
| S0  | 0   | 29  | 6   | 7    | 11   | 81   | 7    | 5   | 8   | 19  | 9   | 0                 |
| S1  | 8   | 25  | 18  | 6    | 10   | 10   | 4    | 4   | 12  | 26  | 10  | 0                 |
| S2  | 12  | 15  | 44  | 115  | 445  | 57   | 439  | 67  | 37  | 18  | 7   | 3                 |
| S3  | 17  | 19  | 78  | 30   | 735  | 14   | 712  | 42  | 71  | 15  | 23  | 2                 |
| S4  | 7   | 90  | 150 | 152  | 275  | 160  | 355  | 132 | 22  | 27  | 13  | 6                 |
| S5  | 58  | 106 | 354 | 1015 | 3305 | 1005 | 3605 | 555 | 305 | 170 | 140 | 10                |
| S6  | 41  | 126 | 257 | 1205 | 2405 | 405  | 2705 | 605 | 218 | 99  | 240 | 9                 |
| S7  | 20  | 7   | 69  | 80   | 529  | 46   | 420  | 38  | 57  | 6   | 19  | 2                 |
| S8  | 6   | 36  | 16  | 27   | 12   | 87   | 13   | 87  | 12  | 33  | 12  | 0                 |
| S9  | 12  | 16  | 9   | 6    | 1    | 52   | 3    | 5   | 8   | 9   | 8   | 0                 |
| S10 | 7   | 9   | 13  | 61   | 25   | 42   | 34   | 44  | 10  | 21  | 7   | 0                 |
| S11 | 12  | 14  | 47  | 67   | 4    | 19   | 4    | 45  | 44  | 16  | 12  | 0                 |
| S12 | 14  | 13  | 51  | 91   | 5    | 46   | 2    | 47  | 55  | 9   | 18  | 0                 |
| S13 | 14  | 12  | 59  | 56   | 20   | 54   | 10   | 38  | 46  | 12  | 15  | 0                 |
| S14 | 19  | 15  | 42  | 4    | 10   | 67   | 3    | 2   | 41  | 15  | 16  | 0                 |
| S15 | 7   | 27  | 23  | 10   | 10   | 5    | 5    | 8   | 21  | 21  | 10  | 0                 |
| S16 | 12  | 23  | 10  | 10   | 41   | 10   | 37   | 5   | 13  | 19  | 15  | 0                 |
| S17 | 15  | 19  | 34  | 65   | 10   | 48   | 5    | 51  | 30  | 31  | 12  | 0                 |
| S18 | 6   | 5   | 24  | 18   | 10   | 12   | 10   | 8   | 16  | 15  | 0   | 0                 |
| S19 | 11  | 14  | 23  | 12   | 20   | 18   | 40   | 25  | 28  | 12  | 13  | 0                 |
| S20 | 12  | 6   | 40  | 36   | 40   | 16   | 30   | 26  | 36  | 0   | 9   | 0                 |

FIG. 15

FIRST CONNECTION STATE

|  | D0 | D1 | D2 | D3 | D4 | D5 | D6 | D7 | D8 | D9 | D10 | D11 | D12 | D13 | D14 | D15 | D16 | D17 | D18 | D19 | D20 | NoiseIndicator(i) |
|---|---|---|---|---|---|---|---|---|---|---|---|---|---|---|---|---|---|---|---|---|---|---|
| S0 | 1 | 3 | 7 | 12 | 2 | 53 | 36 | 15 | 1 | 7 | 2 | 7 | 9 | 9 | 14 | 2 | 7 | 10 | 1 | 6 | 7 | 0 |
| S1 | 24 | 20 | 10 | 14 | 32 | 101 | 121 | 2 | 31 | 11 | 4 | 9 | 8 | 7 | 10 | 22 | 18 | 14 | 0 | 9 | 1 | 2 |
| S2 | 1 | 13 | 39 | 73 | 15 | 349 | 252 | 64 | 11 | 4 | 8 | 42 | 46 | 54 | 37 | 18 | 5 | 29 | 19 | 18 | 35 | 2 |
| S3 | 165 | 157 | 110 | 25 | 147 | 1010 | 1200 | 75 | 122 | 101 | 56 | 62 | 86 | 51 | 147 | 1010 | 1200 | 60 | 13 | 7 | 31 | 11 |
| S4 | 6 | 96 | 440 | 730 | 270 | 3300 | 2400 | 529 | 124 | 96 | 20 | 436 | 575 | 510 | 270 | 3300 | 2400 | 288 | 258 | 161 | 362 | 17 |
| S5 | 76 | 102 | 52 | 9 | 155 | 1000 | 400 | 41 | 105 | 47 | 37 | 14 | 41 | 49 | 155 | 1000 | 400 | 43 | 7 | 13 | 11 | 8 |
| S6 | 2 | 109 | 434 | 707 | 350 | 3600 | 2700 | 415 | 131 | 92 | 29 | 432 | 560 | 500 | 350 | 3600 | 2700 | 270 | 266 | 141 | 375 | 18 |
| S7 | 105 | 109 | 62 | 37 | 127 | 550 | 600 | 33 | 82 | 66 | 39 | 40 | 42 | 33 | 127 | 550 | 600 | 46 | 3 | 20 | 21 | 8 |
| S8 | 3 | 7 | 32 | 66 | 17 | 300 | 213 | 52 | 7 | 3 | 5 | 39 | 50 | 41 | 36 | 16 | 8 | 25 | 11 | 23 | 31 | 2 |
| S9 | 14 | 21 | 13 | 10 | 22 | 66 | 95 | 1 | 28 | 4 | 16 | 11 | 4 | 7 | 10 | 16 | 14 | 26 | 10 | 7 | 0 | 0 |
| S10 | 4 | 5 | 2 | 18 | 8 | 61 | 28 | 14 | 7 | 3 | 2 | 7 | 13 | 10 | 11 | 5 | 10 | 7 | 0 | 8 | 4 | 0 |

FIG. 16

SECOND CONNECTION STATE

|  | D0 | D1 | D2 | D3 | D4 | D5 | D6 | D7 | D8 | D9 | D10 | NoiseIndicator(i) |
|---|---|---|---|---|---|---|---|---|---|---|---|---|
| S0 | 0 | 29 | 6 | 7 | 11 | 81 | 7 | 5 | 8 | 19 | 9 | 0 |
| S1 | 8 | 25 | 18 | 6 | 10 | 10 | 4 | 4 | 12 | 26 | 10 | 0 |
| S2 | 12 | 15 | 44 | 115 | 445 | 57 | 439 | 67 | 37 | 18 | 7 | 3 |
| S3 | 17 | 19 | 78 | 30 | 735 | 14 | 712 | 42 | 71 | 15 | 23 | 2 |
| S4 | 7 | 90 | 150 | 152 | 275 | 160 | 355 | 132 | 22 | 27 | 13 | 6 |
| S5 | 58 | 106 | 354 | 1015 | 3305 | 1005 | 3605 | 555 | 305 | 170 | 140 | 10 |
| S6 | 41 | 126 | 257 | 1205 | 2405 | 405 | 2705 | 605 | 218 | 99 | 240 | 9 |
| S7 | 20 | 7 | 69 | 80 | 529 | 46 | 420 | 38 | 57 | 6 | 19 | 2 |
| S8 | 6 | 36 | 16 | 27 | 12 | 87 | 13 | 87 | 12 | 33 | 12 | 0 |
| S9 | 12 | 16 | 9 | 6 | 1 | 52 | 3 | 5 | 8 | 9 | 8 | 0 |
| S10 | 7 | 9 | 13 | 61 | 25 | 42 | 34 | 44 | 10 | 21 | 7 | 0 |
| S11 | 12 | 14 | 47 | 67 | 4 | 19 | 4 | 45 | 44 | 16 | 12 | 0 |
| S12 | 14 | 13 | 51 | 91 | 5 | 46 | 2 | 47 | 55 | 9 | 18 | 0 |
| S13 | 14 | 12 | 59 | 56 | 20 | 54 | 10 | 38 | 46 | 12 | 15 | 0 |
| S14 | 12 | 15 | 44 | 115 | 445 | 57 | 439 | 67 | 37 | 18 | 7 | 3 |
| S15 | 17 | 19 | 78 | 30 | 735 | 14 | 712 | 42 | 71 | 15 | 23 | 2 |
| S16 | 7 | 90 | 150 | 152 | 275 | 160 | 355 | 132 | 22 | 27 | 13 | 6 |
| S17 | 58 | 106 | 354 | 1015 | 3305 | 1005 | 3605 | 555 | 305 | 71 | 66 | 8 |
| S18 | 41 | 126 | 257 | 1205 | 2405 | 405 | 2705 | 605 | 218 | 99 | 33 | 8 |
| S19 | 20 | 7 | 69 | 80 | 529 | 46 | 420 | 38 | 57 | 6 | 19 | 2 |
| S20 | 12 | 6 | 40 | 36 | 40 | 16 | 30 | 26 | 36 | 0 | 9 | 0 |

FIG. 20

FIRST FRAME, FIRST CONNECTION STATE

| | D0 | D1 | D2 | D3 | D4 | D5 | D6 | D7 | D8 | D9 | D10 | D11 | D12 | D13 | D14 | D15 | D16 | D17 | D18 | D19 | D20 | NoiseIndicator(i) |
|---|---|---|---|---|---|---|---|---|---|---|---|---|---|---|---|---|---|---|---|---|---|---|
| S0 | 1 | 3 | 7 | 12 | 2 | 53 | 36 | 15 | 1 | 7 | 2 | 7 | 9 | 9 | 14 | 2 | 7 | 10 | 1 | 6 | 7 | 0 |
| S1 | 24 | 20 | 10 | 14 | 32 | 101 | 121 | 2 | 31 | 11 | 4 | 9 | 8 | 7 | 10 | 22 | 18 | 14 | 0 | 9 | 1 | 2 |
| S2 | 1 | 13 | 39 | 73 | 15 | 349 | 252 | 64 | 11 | 4 | 8 | 42 | 46 | 54 | 37 | 18 | 5 | 29 | 19 | 18 | 35 | 2 |
| S3 | 165 | 157 | 110 | 25 | 147 | 1010 | 1200 | 75 | 122 | 101 | 56 | 62 | 86 | 51 | 116 | 99 | 185 | 60 | 13 | 7 | 31 | 10 |
| S4 | 6 | 96 | 440 | 730 | 270 | 3300 | 2400 | 529 | 124 | 96 | 20 | 436 | 575 | 510 | 374 | 180 | 36 | 288 | 258 | 161 | 362 | 16 |
| S5 | 76 | 102 | 52 | 9 | 155 | 1000 | 400 | 300 | 200 | 150 | 37 | 14 | 41 | 49 | 62 | 80 | 102 | 43 | 7 | 13 | 11 | 8 |
| S6 | 2 | 109 | 434 | 707 | 350 | 3600 | 2700 | 415 | 131 | 92 | 29 | 432 | 560 | 500 | 350 | 186 | 32 | 270 | 266 | 141 | 375 | 17 |
| S7 | 105 | 109 | 62 | 37 | 127 | 550 | 600 | 33 | 82 | 66 | 39 | 40 | 42 | 33 | 69 | 75 | 107 | 46 | 3 | 20 | 21 | 6 |
| S8 | 3 | 7 | 32 | 66 | 17 | 300 | 213 | 52 | 7 | 3 | 5 | 39 | 50 | 41 | 36 | 16 | 8 | 25 | 11 | 23 | 31 | 2 |
| S9 | 14 | 21 | 13 | 10 | 22 | 66 | 95 | 1 | 28 | 4 | 16 | 11 | 4 | 7 | 10 | 16 | 14 | 26 | 10 | 7 | 0 | 0 |
| S10 | 4 | 5 | 2 | 18 | 8 | 61 | 28 | 14 | 7 | 3 | 2 | 7 | 13 | 10 | 11 | 5 | 10 | 7 | 0 | 8 | 4 | 0 |

FIG. 21

SECOND FRAME, SECOND CONNECTION STATE

|  | D0 | D1 | D2 | D3 | D4 | D5 | D6 | D7 | D8 | D9 | D10 | NoiseIndicator(i) |
|---|---|---|---|---|---|---|---|---|---|---|---|---|
| S0 | 5 | 2 | 6 | 7 | 11 | 4 | 7 | 5 | 8 | 19 | 9 | 0 |
| S1 | 0 | 29 | 6 | 7 | 11 | 81 | 7 | 5 | 8 | 19 | 9 | 0 |
| S2 | 8 | 25 | 18 | 6 | 10 | 10 | 4 | 4 | 12 | 26 | 10 | 0 |
| S3 | 12 | 15 | 44 | 115 | 445 | 57 | 439 | 67 | 37 | 18 | 7 | 3 |
| S4 | 17 | 19 | 78 | 30 | 735 | 14 | 712 | 42 | 71 | 15 | 23 | 2 |
| S5 | 7 | 90 | 150 | 152 | 275 | 160 | 355 | 132 | 22 | 27 | 13 | 6 |
| S6 | 58 | 106 | 354 | 1015 | 3305 | 1005 | 3605 | 555 | 305 | 170 | 140 | 10 |
| S7 | 41 | 126 | 257 | 1205 | 2405 | 405 | 2705 | 605 | 218 | 99 | 240 | 9 |
| S8 | 20 | 7 | 69 | 80 | 529 | 46 | 420 | 38 | 57 | 6 | 19 | 2 |
| S9 | 6 | 36 | 16 | 27 | 12 | 87 | 13 | 87 | 12 | 33 | 12 | 0 |
| S10 | 12 | 16 | 9 | 6 | 1 | 52 | 3 | 5 | 8 | 9 | 8 | 0 |
| S11 | 7 | 9 | 13 | 61 | 25 | 42 | 34 | 44 | 10 | 21 | 7 | 0 |
| S12 | 12 | 14 | 47 | 67 | 4 | 19 | 4 | 45 | 44 | 16 | 12 | 0 |
| S13 | 14 | 13 | 51 | 91 | 5 | 46 | 2 | 47 | 55 | 9 | 18 | 0 |
| S14 | 14 | 12 | 59 | 56 | 20 | 54 | 10 | 38 | 46 | 12 | 15 | 0 |
| S15 | 19 | 15 | 42 | 4 | 10 | 67 | 3 | 2 | 41 | 15 | 16 | 0 |
| S16 | 7 | 27 | 23 | 10 | 10 | 5 | 5 | 8 | 21 | 21 | 10 | 0 |
| S17 | 12 | 23 | 10 | 10 | 41 | 10 | 37 | 5 | 13 | 19 | 15 | 0 |
| S18 | 15 | 19 | 34 | 65 | 10 | 48 | 5 | 51 | 30 | 31 | 12 | 0 |
| S19 | 6 | 5 | 24 | 18 | 10 | 12 | 10 | 8 | 16 | 15 | 0 | 0 |
| S20 | 11 | 14 | 23 | 12 | 20 | 18 | 40 | 25 | 28 | 12 | 13 | 0 |

FIG. 22

THIRD FRAME, FIRST CONNECTION STATE

| | D0 | D1 | D2 | D3 | D4 | D5 | D6 | D7 | D8 | D9 | D10 | D11 | D12 | D13 | D14 | D15 | D16 | D17 | D18 | D19 | D20 | NoiseIndicator(i) |
|---|---|---|---|---|---|---|---|---|---|---|---|---|---|---|---|---|---|---|---|---|---|---|
| S0 | 1 | 1 | 1 | 3 | 7 | 12 | 2 | 53 | 36 | 15 | 1 | 7 | 2 | 7 | 9 | 9 | 14 | 2 | 7 | 10 | 1 | 0 |
| S1 | 24 | 24 | 24 | 20 | 10 | 14 | 32 | 101 | 121 | 2 | 31 | 11 | 4 | 9 | 8 | 7 | 10 | 22 | 18 | 14 | 0 | 2 |
| S2 | 1 | 1 | 1 | 13 | 39 | 73 | 15 | 349 | 252 | 64 | 11 | 4 | 8 | 42 | 46 | 54 | 37 | 18 | 5 | 29 | 19 | 2 |
| S3 | 4 | 110 | 165 | 157 | 110 | 25 | 147 | 1010 | 1200 | 75 | 122 | 101 | 56 | 62 | 86 | 51 | 116 | 99 | 185 | 60 | 13 | 11 |
| S4 | 200 | 6 | 6 | 96 | 440 | 730 | 270 | 3300 | 2400 | 529 | 124 | 96 | 20 | 436 | 575 | 510 | 374 | 180 | 36 | 288 | 258 | 15 |
| S5 | 76 | 76 | 76 | 102 | 52 | 9 | 155 | 1000 | 400 | 300 | 200 | 150 | 37 | 14 | 41 | 49 | 62 | 80 | 102 | 43 | 7 | 8 |
| S6 | 120 | 109 | 50 | 109 | 434 | 707 | 350 | 3600 | 2700 | 415 | 131 | 92 | 29 | 432 | 560 | 500 | 350 | 186 | 32 | 270 | 266 | 17 |
| S7 | 2 | 2 | 105 | 109 | 62 | 37 | 127 | 550 | 600 | 33 | 82 | 66 | 39 | 40 | 42 | 33 | 69 | 75 | 107 | 46 | 3 | 6 |
| S8 | 3 | 3 | 3 | 7 | 32 | 66 | 17 | 300 | 213 | 52 | 7 | 3 | 5 | 39 | 50 | 41 | 36 | 16 | 8 | 25 | 11 | 2 |
| S9 | 14 | 14 | 14 | 21 | 13 | 10 | 22 | 66 | 95 | 1 | 28 | 4 | 16 | 11 | 4 | 7 | 10 | 16 | 14 | 26 | 10 | 0 |
| S10 | 4 | 4 | 4 | 5 | 2 | 18 | 8 | 61 | 28 | 14 | 7 | 3 | 2 | 7 | 13 | 10 | 11 | 5 | 10 | 7 | 0 | 0 |

FIG. 23

FOURTH FRAME, SECOND CONNECTION STATE

| | D0 | D1 | D2 | D3 | D4 | D5 | D6 | D7 | D8 | D9 | D10 | NoiseIndicator(i) |
|---|---|---|---|---|---|---|---|---|---|---|---|---|
| S0 | 0 | 29 | 6 | 7 | 11 | 81 | 7 | 5 | 8 | 19 | 9 | 0 |
| S1 | 0 | 29 | 6 | 7 | 11 | 81 | 7 | 5 | 8 | 19 | 9 | 0 |
| S2 | 8 | 25 | 18 | 6 | 10 | 10 | 4 | 4 | 12 | 26 | 10 | 0 |
| S3 | 0 | 29 | 6 | 7 | 11 | 81 | 7 | 5 | 8 | 19 | 9 | 0 |
| S4 | 8 | 25 | 18 | 6 | 10 | 10 | 4 | 4 | 12 | 26 | 10 | 0 |
| S5 | 12 | 15 | 44 | 115 | 445 | 57 | 439 | 67 | 37 | 18 | 7 | 3 |
| S6 | 17 | 19 | 78 | 30 | 735 | 14 | 712 | 42 | 71 | 15 | 23 | 2 |
| S7 | 7 | 90 | 150 | 152 | 275 | 160 | 355 | 132 | 22 | 27 | 13 | 6 |
| S8 | 58 | 106 | 354 | 1015 | 3305 | 1005 | 3605 | 555 | 305 | 170 | 140 | 10 |
| S9 | 41 | 126 | 257 | 1205 | 2405 | 405 | 2705 | 605 | 218 | 99 | 240 | 9 |
| S10 | 20 | 7 | 69 | 80 | 529 | 46 | 420 | 38 | 57 | 6 | 19 | 2 |
| S11 | 6 | 36 | 16 | 27 | 12 | 87 | 13 | 87 | 12 | 33 | 12 | 0 |
| S12 | 12 | 16 | 9 | 6 | 1 | 52 | 3 | 5 | 8 | 9 | 8 | 0 |
| S13 | 7 | 9 | 13 | 61 | 25 | 42 | 34 | 44 | 10 | 21 | 7 | 0 |
| S14 | 12 | 14 | 47 | 67 | 4 | 19 | 4 | 45 | 44 | 16 | 12 | 0 |
| S15 | 14 | 13 | 51 | 91 | 5 | 46 | 2 | 47 | 55 | 9 | 18 | 0 |
| S16 | 14 | 12 | 59 | 56 | 20 | 54 | 10 | 38 | 46 | 12 | 15 | 0 |
| S17 | 19 | 15 | 42 | 4 | 10 | 67 | 3 | 2 | 41 | 15 | 16 | 0 |
| S18 | 7 | 27 | 23 | 10 | 10 | 5 | 5 | 8 | 21 | 21 | 10 | 0 |
| S19 | 12 | 23 | 10 | 10 | 41 | 10 | 37 | 5 | 13 | 19 | 15 | 0 |
| S20 | 6 | 5 | 24 | 18 | 10 | 12 | 10 | 8 | 16 | 15 | 0 | 0 |

TOUCH PANEL SYSTEM, AND CAPACITANCE VALUE DISTRIBUTION DETECTING DEVICE HAVING NOISE DETERMINING SECTION

TECHNICAL FIELD

The present invention relates to an electrostatic capacitance value distribution detecting device which detects distribution of values of a plurality of electrostatic capacitances that are formed at respective intersections where a plurality of first signal lines intersect a plurality of second signal lines.

BACKGROUND ART

A touch panel device includes various touch panel devices. Among these touch panel devices, an electrostatic capacitive touch panel device is highly convenient because a user can operate it with, e.g., a finger of the user or a mere electrically-conductive pen without any special pen.

However, in a case where a user who is being subjected to electromagnetic noise (from, e.g., a fluorescent light, a switching power source, an electronic device, or a radio) touches a touch panel device via an indicator (a finger of the user or an electrically-conductive pen), the electromagnetic noise enters the touch panel device. The electromagnetic noise which is gotten by a human body etc. and enters the touch panel device via the indicator is called "external noise". The touch panel device which the external noise has entered will probably detect an incorrect touch position.

Some conventional touch panel devices have a system for removing external noise.

Patent Literature 1 describes an electrostatic capacitive touch panel device which avoids being affected by external noise. This touch panel device detects degree of variation in level signal outputted from a reception section, and carries out a sampling at timing when the degree is small. This touch panel device determines a sampling timing of a sample holding section or a frequency of a driving signal so that the degree is reduced. This makes it possible to obtain a stable output signal which is not affected by external noise.

Patent Literature 2 describes an electrostatic capacitive touch panel device which avoids being affected by external noise. This touch panel device changes a frequency of one of driving signals to another frequency in a case where the frequency of the driving signal equals to a frequency of external noise. This differentiates, from the frequency of the external noise, a frequency of a voltage signal which frequency equals to the frequency of the driving signal. In addition, the external noise is removed by use of a band pass filter for filtering a component of a frequency different from the frequency of the driving signal.

Patent Literature 3 describes a touch panel device which employs a surface acoustic wave method. This touch panel device determines, from a reception signal based on a burst wave of the surface acoustic wave method, whether or not noise exists. In a case where the touch panel device determines that noise exists, the touch panel device does not detect an object on the basis of the reception signal.

CITATION LIST

Patent Literatures

Patent Literature 1
Japanese Patent Application Publication, Tokukai, No. 2011-128858 (Publication Date: Jun. 30, 2011)
Patent Literature 2
Japanese Patent Application Publication, Tokukai, No. 2011-128857 (Publication Date: Jun. 30, 2011)
Patent Literature 3
Japanese Patent Application Publication, Tokukai, No. 2006-268288 (Publication Date: Oct. 5, 2006)
Patent Literature 4
Japanese Patent Application Publication, Tokukai, No. 2012-118957 (Publication Date: Jun. 21, 2012)

SUMMARY OF INVENTION

Technical Problem

However, in a case where a frequency of external noise is utilized to remove the external noise (see Patent Literatures 1 and 2), it is not possible to remove the external noise unless the frequency is found. Alternatively, in a case where a system fails to find that external noise has entered, it is not possible to appropriately remove the external noise.

A conventional electrostatic capacitive touch panel device failed to appropriately detect external noise which has entered the touch panel device.

The present invention was made in view of the problems. According to an aspect of the present invention, it is possible to realize an electrostatic capacitance value distribution detecting device capable of determining whether or not external noise exists.

Solution to Problem

An electrostatic capacitance value distribution detecting device of an aspect of the present invention is configured to be an electrostatic capacitance value distribution detecting device for detecting distribution of values of a plurality of electrostatic capacitances that are formed at respective intersections where a plurality of first signal lines intersect a plurality of second signal lines, the electrostatic capacitance value distribution detecting device detecting the distribution by (i) driving the plurality of first signal lines at a first time to output, from the plurality of second signal lines, electric charges corresponding to the plurality of electrostatic capacitances, (ii) switching connection of the plurality of first and second signal lines at a second time after the first time, and (iii) driving the plurality of second signal lines at a third time after the second time to output, from the plurality of first signal lines, electric charges corresponding to the plurality of electrostatic capacitances, the electrostatic capacitance value distribution detecting device including an external noise determining section which determines whether or not external noise exists, the external noise being generated via a touching indicator along a direction in which the electric charges are outputted.

An electrostatic capacitance value distribution detecting device of an aspect of the present invention is configured to be an electrostatic capacitance value distribution detecting device for detecting distribution of values of a plurality of electrostatic capacitances that are formed at respective intersections where a plurality of first signal lines intersect a plurality of second signal lines, the electrostatic capacitance value distribution detecting device detecting the distribution by (i) driving the plurality of first signal lines at a first time to output, from the plurality of second signal lines, electric charges corresponding to the plurality of electrostatic capacitances, (ii) switching connection of the plurality of first and second signal lines at a second time after the first time, and (iii) driving the plurality of second signal lines at a third time after the second time to output, from the plurality of first signal lines, electric charges corresponding to the plurality of electrostatic capacitances, the electrostatic capacitance value distribution detecting device including an external noise determining section which determines whether or not external noise exists, the external noise being generated via a touching first indicator and a touching second indicator along a direction in which the electric charges are outputted, in a case where the number of electrostatic capacitances where signals corresponding to the values exceed a detection threshold is a threshold exceeding electrostatic capacitance number, the external noise determining section detecting the external noise on the basis of (i) a first threshold exceeding electrostatic capacitance number of a first detection region along one of the plurality of first signal lines, (ii) a second threshold exceeding electrostatic capacitance number of a second detection region along one of the plurality of second signal lines, (iii) a third threshold exceeding electrostatic capacitance number of a third detection region along one of the plurality of first signal lines, and (iv) a fourth threshold exceeding electrostatic capacitance number of a fourth detection region along one of the plurality of second signal lines, and the external noise determining section detecting the second threshold exceeding electrostatic capacitance number and the fourth threshold exceeding electrostatic capacitance number at the first time, and detecting the first threshold exceeding electrostatic capacitance number and the third threshold exceeding electrostatic capacitance number at the third time.

Advantageous Effects of Invention

According to an aspect of the present invention, an electrostatic capacitance value distribution detecting device which detects distribution of electrostatic capacitance values can determine whether or not electromagnetic noise which is gotten by a human body etc. and enters via an indicator, i.e., external noise exists.

Figure 5:
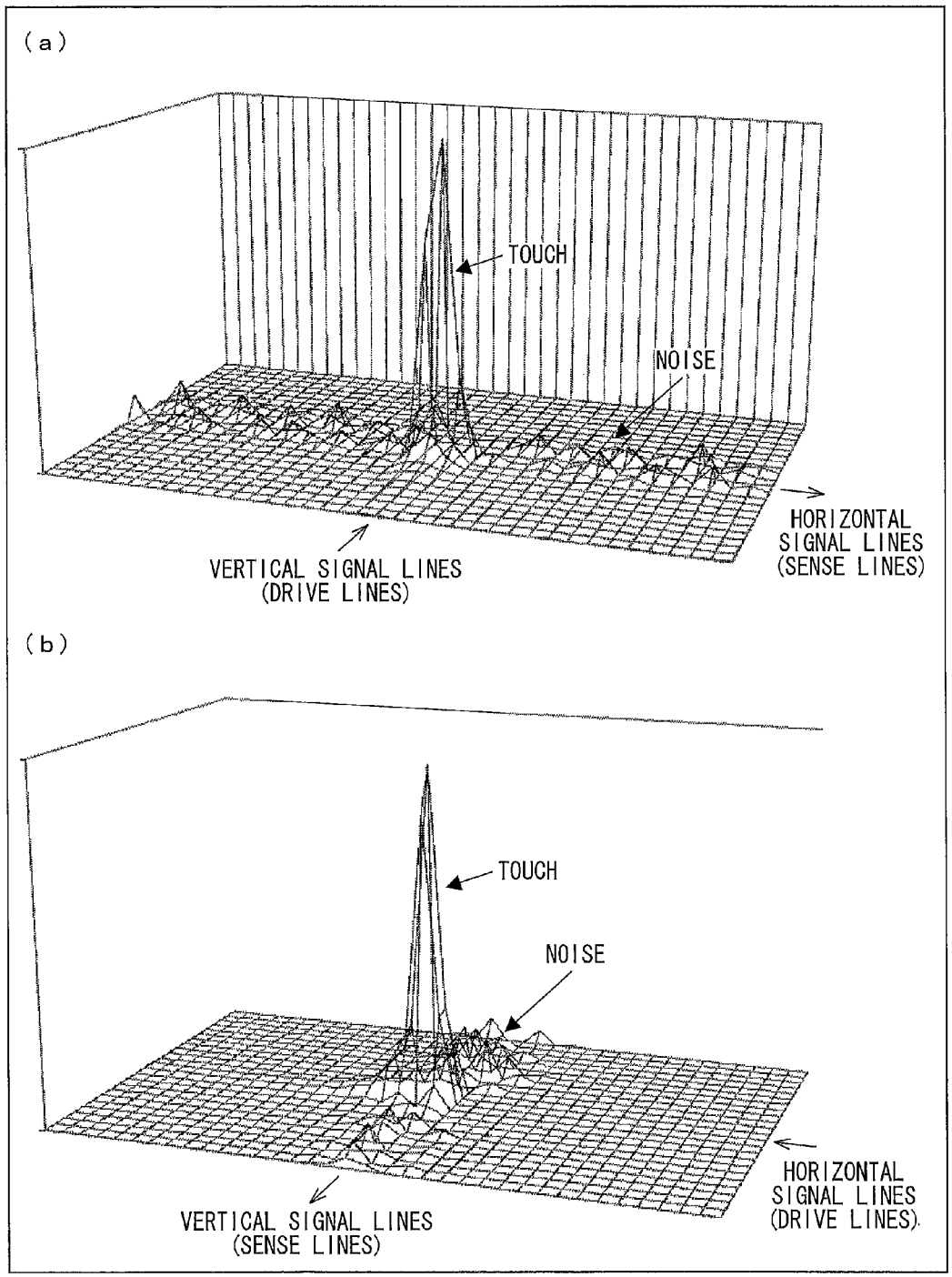

(a) of FIG. 5 is a view illustrating a sense signal intensity distribution in a case where (i) vertical signal lines are electrically connected to drive lines and (ii) horizontal signal lines are electrically connected to sense lines. (b) of FIG. 5 is a view illustrating a sense signal intensity distribution in a case where (i) the horizontal signal lines are electrically connected to the drive lines and (ii) the vertical signal lines are electrically connected to the sense lines.

Figure 6:
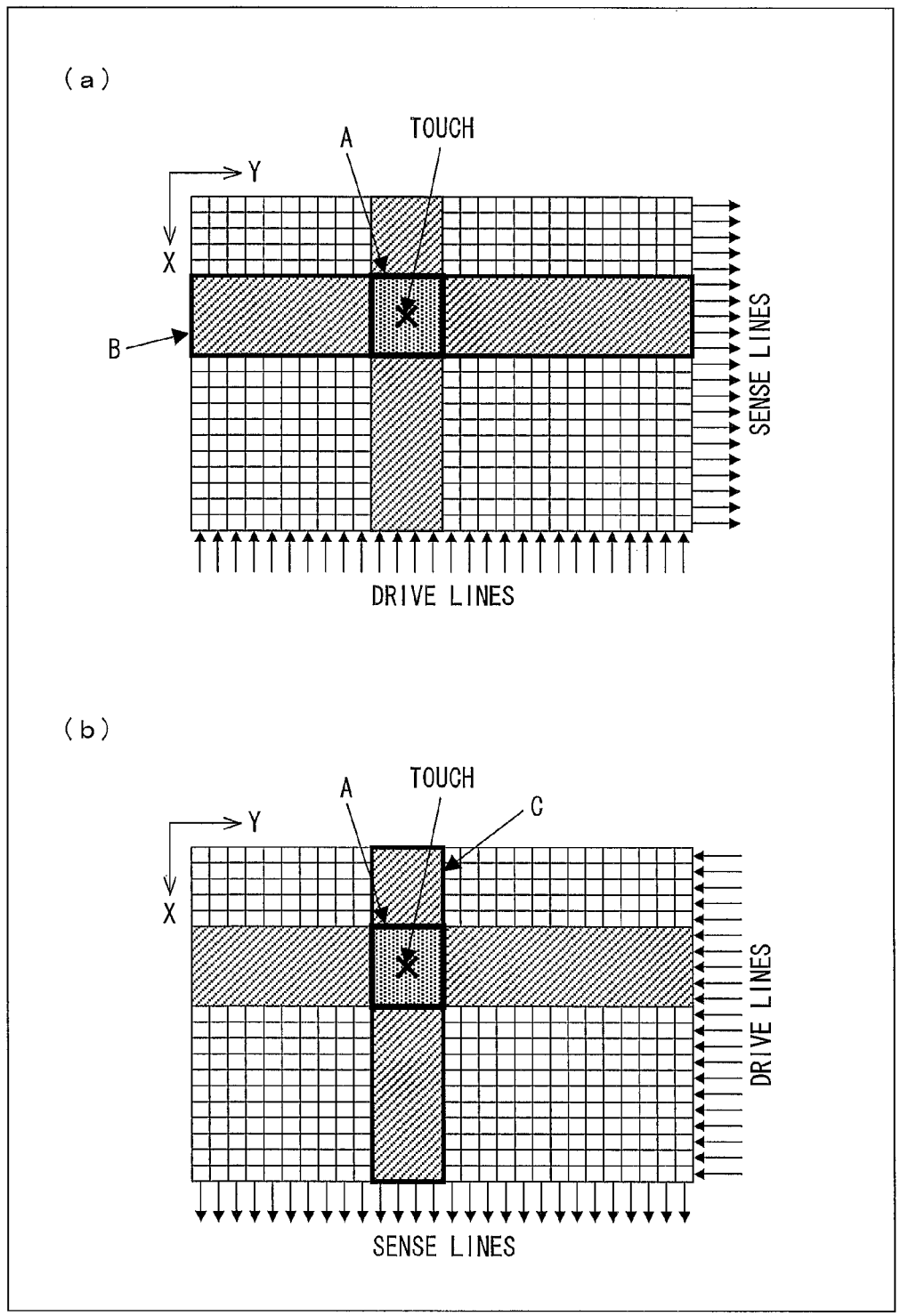

(a) of FIG. 6 is a view illustrating a region touched in a first connection state and a region where noise appears. (b) of FIG. 6 is a view illustrating a region touched in a second connection state and a region where noise appears.

Figure 7:
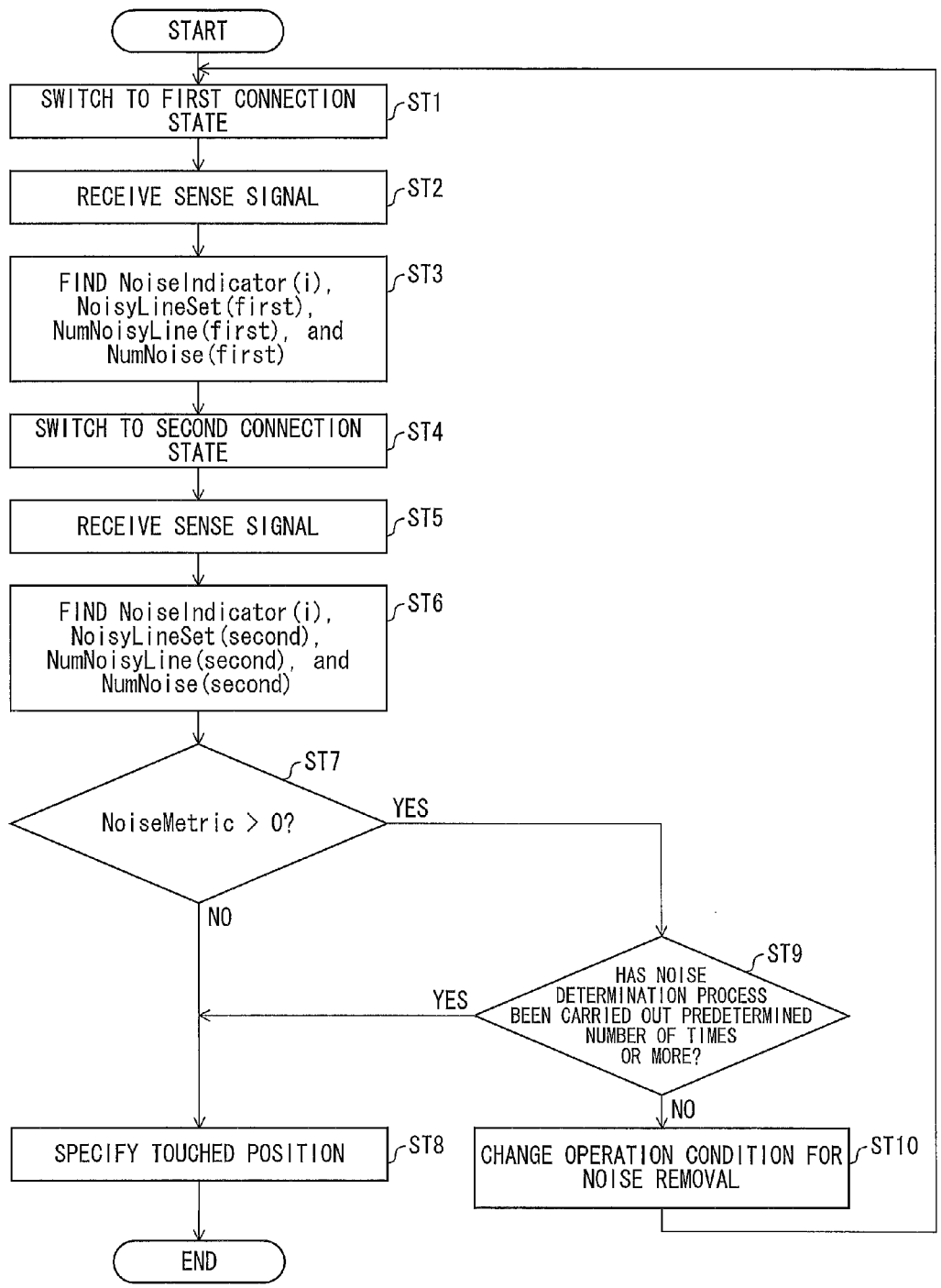

FIG. 7 is a flowchart illustrating a flow of noise detection of the embodiment of the present invention.

Figure 8:
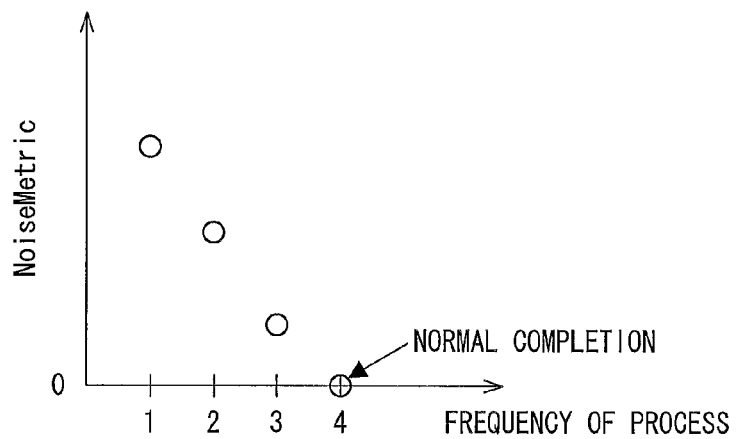

FIG. 8 is a graph illustrating an example of noise indicators NoiseMetric for respective normally-completed plural noise determination processes in the noise detection of the embodiment of the present invention.

Figure 9:
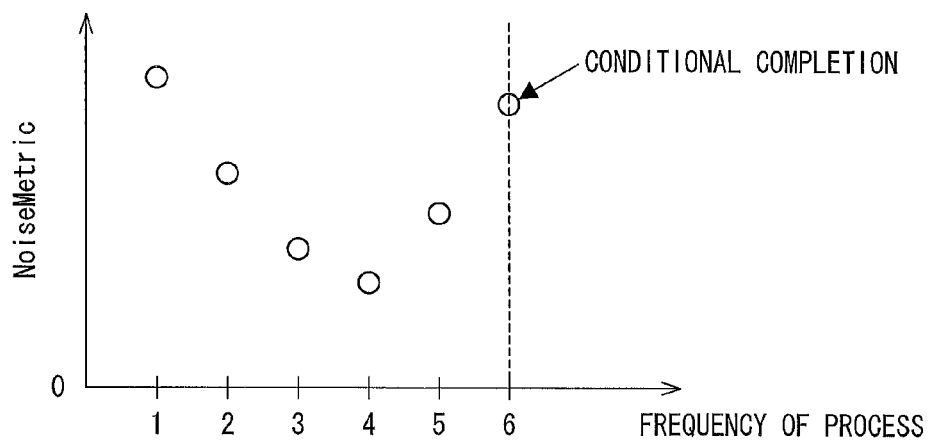

FIG. 9 is a graph illustrating an example of noise indicators NoiseMetric for respective conditionally-completed plural noise determination processes in the noise detection of the embodiment of the present invention.

Figure 10:
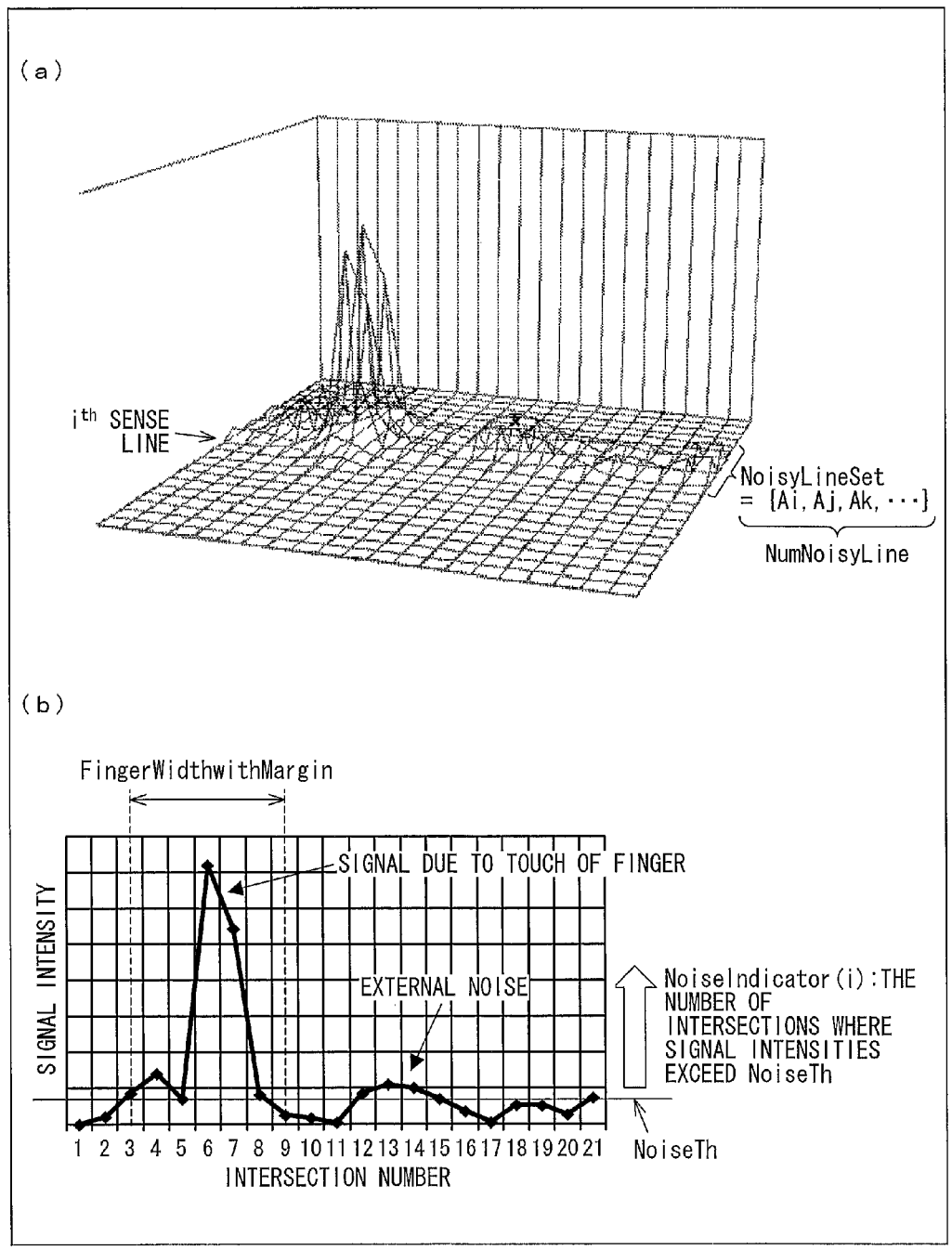

FIG. 10 is an explanatory view explaining parameters for the noise detection of the embodiment of the present invention.

FIG. 11 is a table illustrating a specific example of a sense signal intensity distribution found in the first connection state of the embodiment.

Similar to FIG. 11, FIG. 12 is a table illustrating a specific example of a sense signal intensity distribution found in the second connection state of the embodiment.

FIG. 13 is a table illustrating another specific example of the sense signal intensity distribution found in the first connection state of the embodiment.

Similar to FIG. 13, FIG. 14 is a table illustrating another specific example of the sense signal intensity distribution found in the second connection state of the embodiment.

FIG. 15 is a table illustrating yet another specific example of the sense signal intensity distribution found in the first connection state of the embodiment.

Similar to FIG. 15, FIG. 16 is a table illustrating yet another specific example of the sense signal intensity distribution found in the second connection state of the embodiment.

Figure 17:
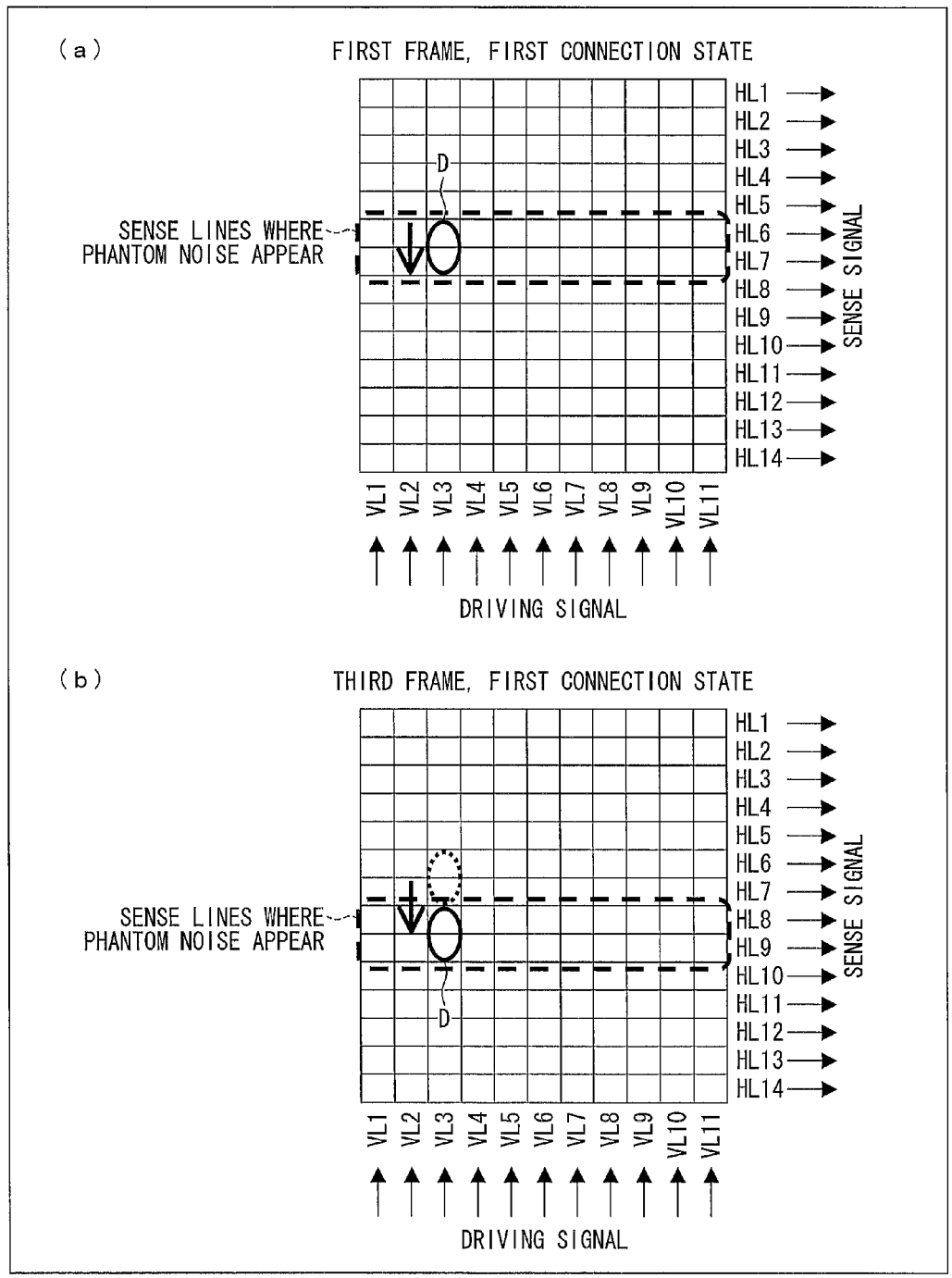

(a) of FIG. 17 is a view illustrating a state at a first time (during a first frame) in a case where an indicator is moving at high speed. (b) of FIG. 17 is a view illustrating a state at a fifth time (during a third frame) in the case where the indicator is moving at high speed.

Figure 18:
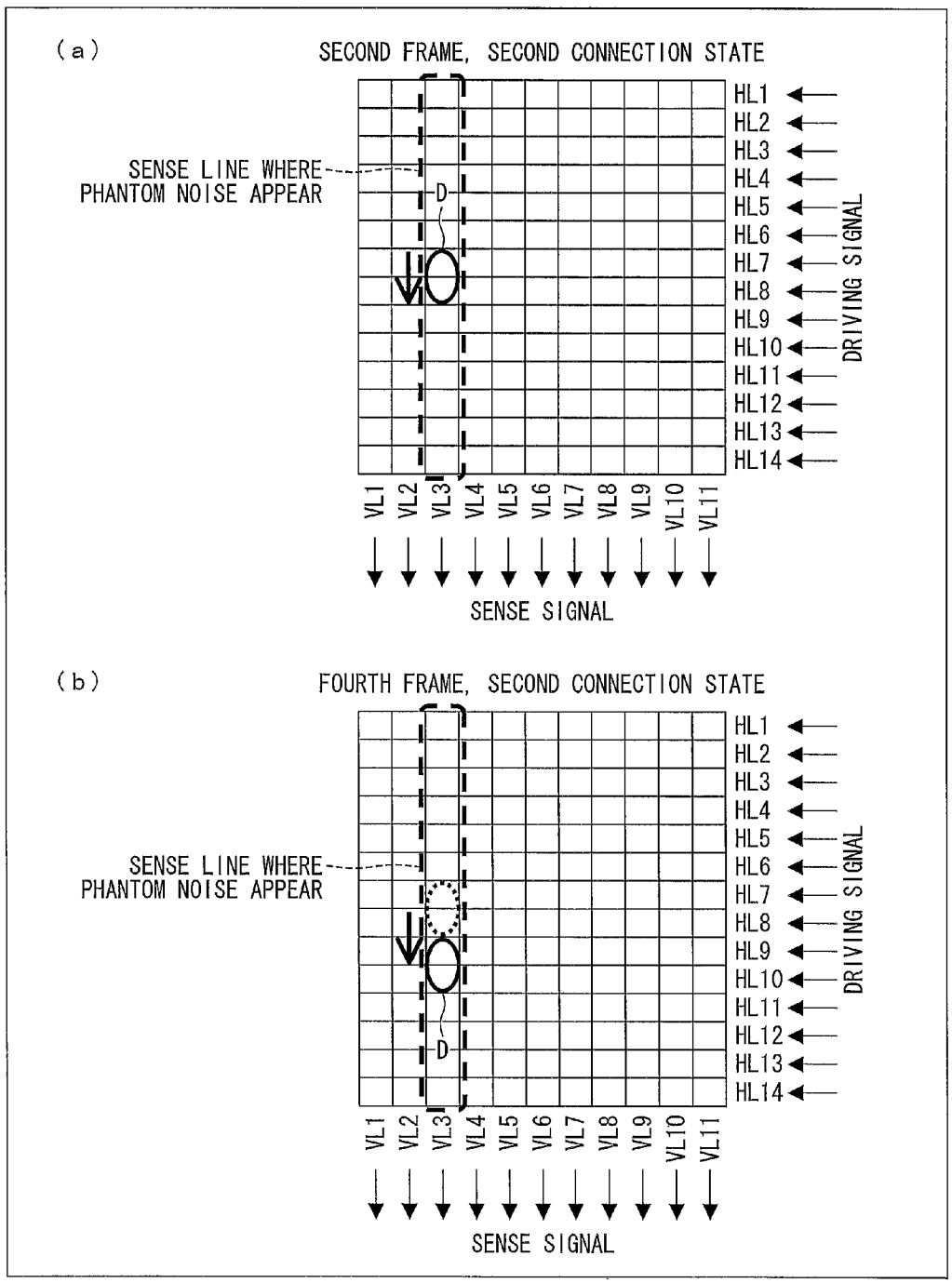

(a) of FIG. 18 is a view illustrating a state at a third time (during a second frame) in the case where the indicator is moving at high speed. (b) of FIG. 18 is a view illustrating a state at a seventh time (during a fourth frame) in the case where the indicator is moving at high speed.

Figure 19:
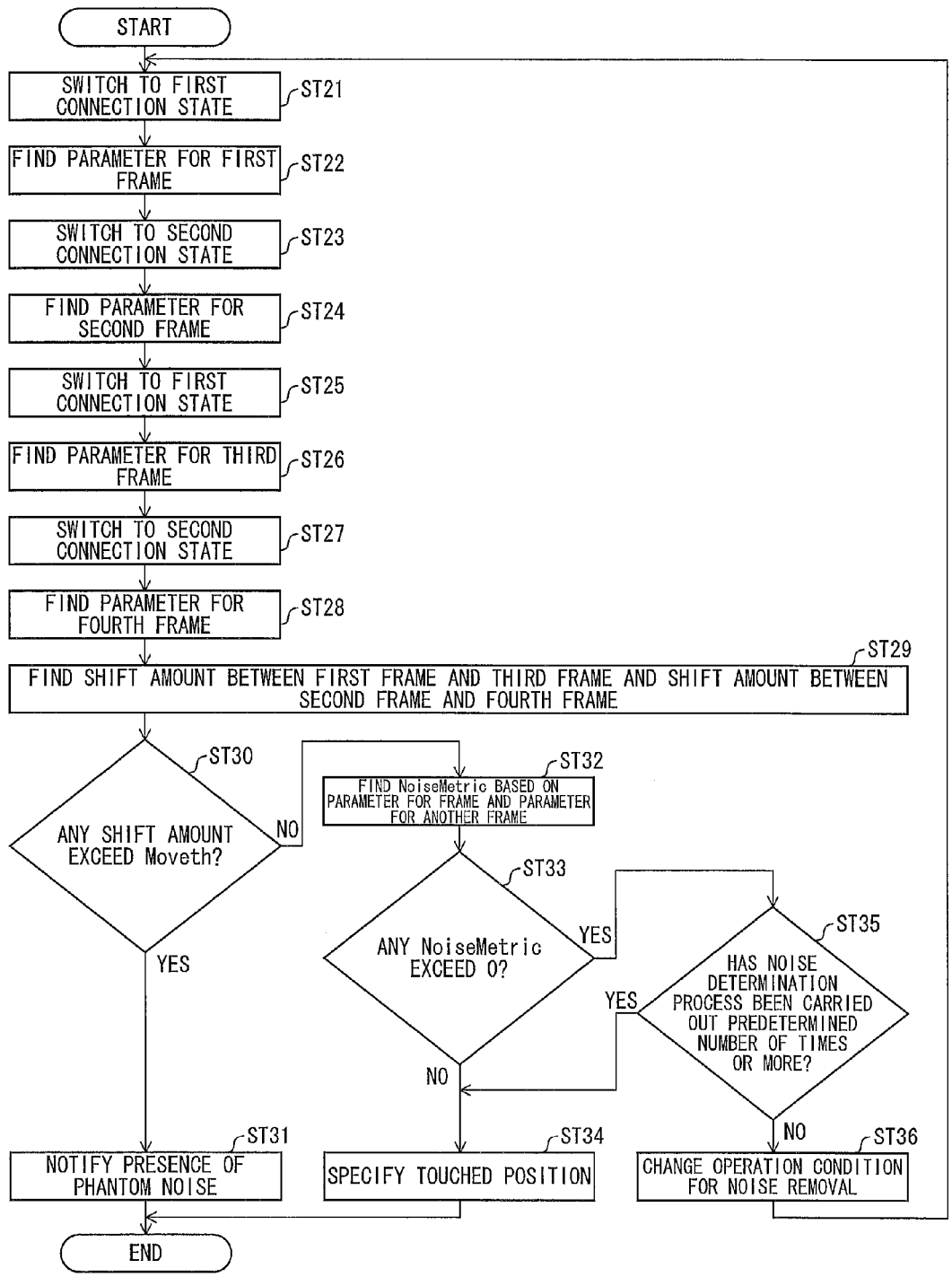

FIG. 19 is a flowchart illustrating a flow of noise detection of another embodiment of the present invention.

FIG. 20 is a table illustrating a specific example of a sense signal intensity distribution found during a first frame (in a first connection state) of the another embodiment.

FIG. 21 is a table illustrating a specific example of a sense signal intensity distribution found during a second frame (in the second connection state) of the another embodiment.

FIG. 22 is a table illustrating a specific example of a sense signal intensity distribution found during a third frame (in the first connection state) of the another embodiment.

FIG. 23 is a table illustrating a specific example of a sense signal intensity distribution found during a fourth frame (in the second connection state) of the another embodiment.

Figure 24:
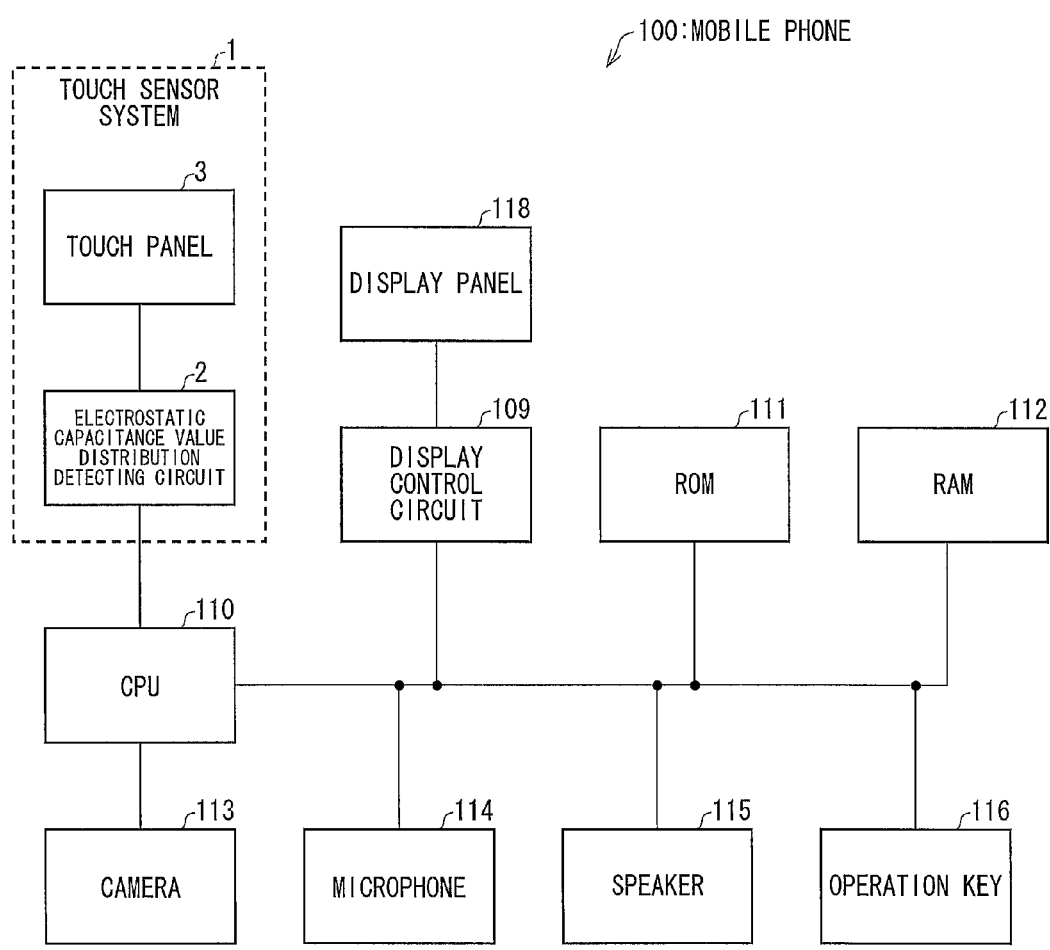

FIG. 24 is a block diagram illustrating a configuration of a mobile phone of yet another embodiment of the present invention.

Figure 25:
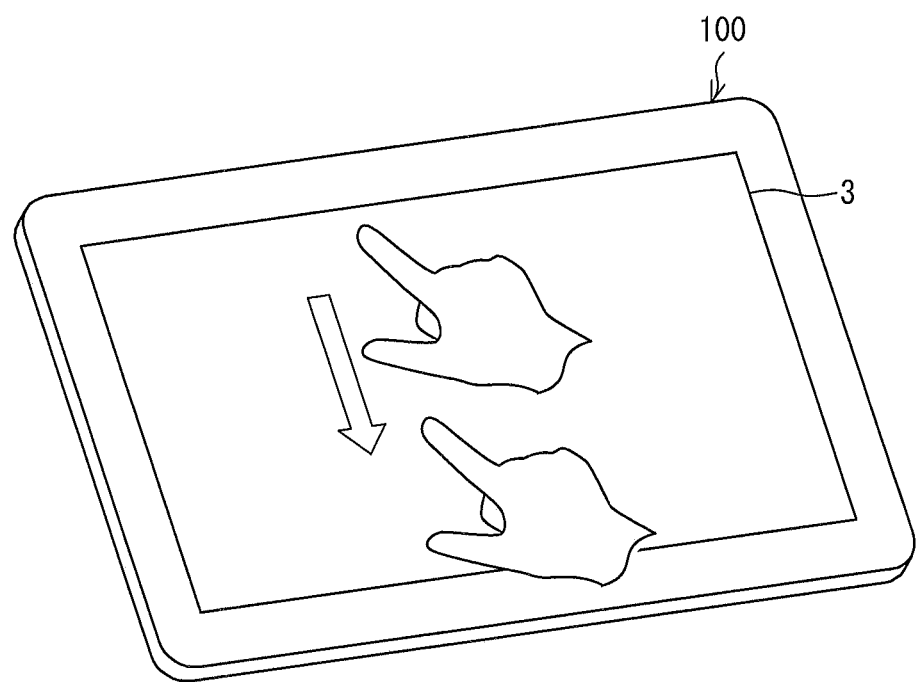

FIG. 25 is a view illustrating an appearance of the mobile phone of the yet another embodiment of the present invention.

DESCRIPTION OF EMBODIMENTS

Embodiment 1

The following description will discuss in detail Embodiment 1 of the present invention.

(Configuration of Touch Sensor System 1)

Figure 1:
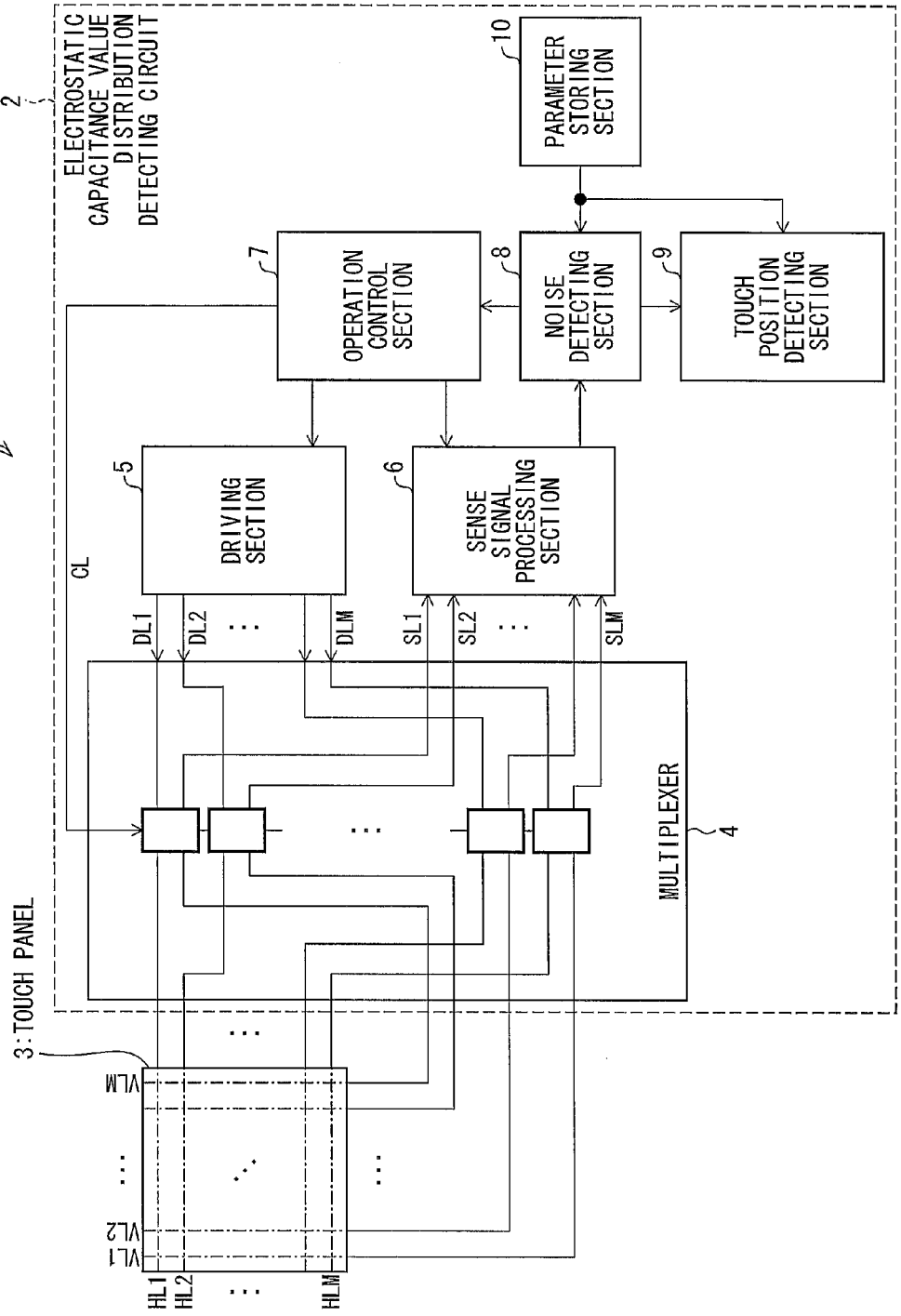
FIG. 1 is a block diagram illustrating a configuration of a touch sensor system of an embodiment of the present invention.
Figure 2:
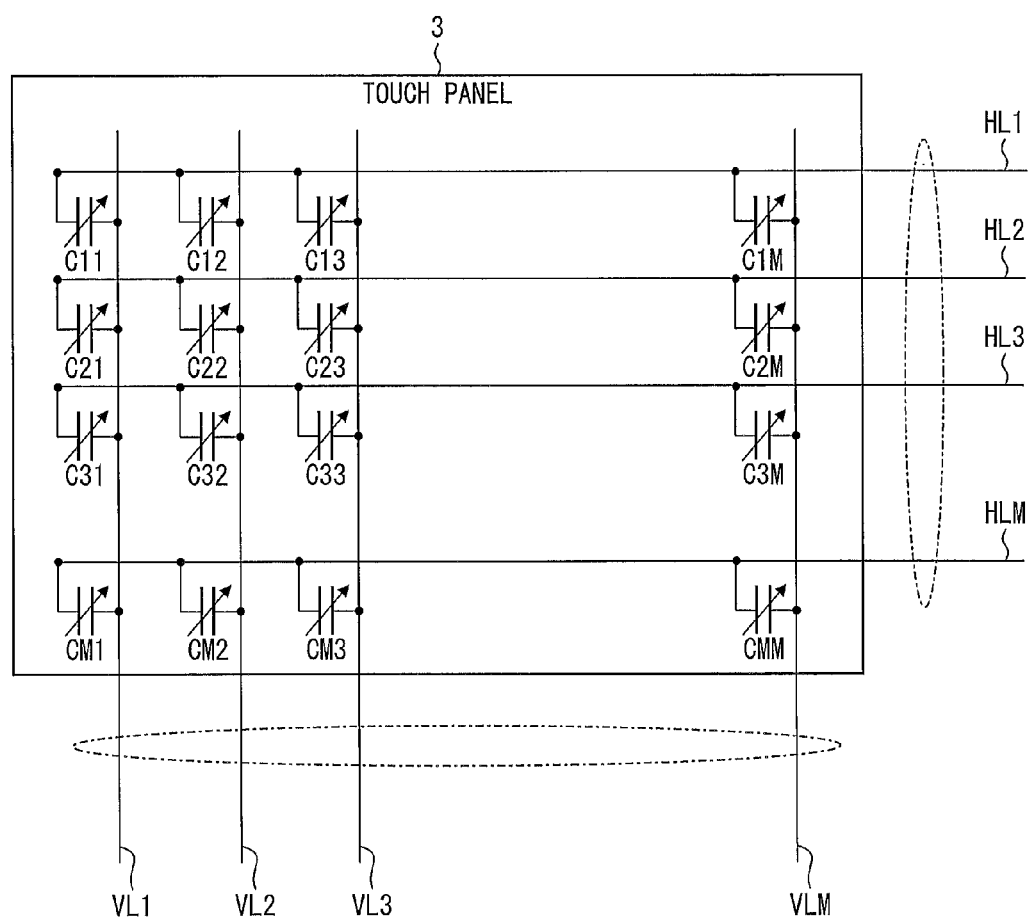
FIG. 2 is a view schematically illustrating a configuration of a touch panel included in the touch sensor system of the embodiment of the present invention.

FIG. 1 is a block diagram illustrating a configuration of a touch sensor system 1 (touch panel device) of Embodiment 1. FIG. 2 is a view schematically illustrating a configuration of a touch panel 3 included in the touch sensor system 1.

The touch sensor system 1 includes the touch panel 3 and an electrostatic capacitance value distribution detecting circuit 2 (electrostatic capacitance value distribution detecting device). The touch panel 3 includes (i) horizontal signal lines HL1 through HLM (second signal lines) which are provided to extend in a horizontal direction (lateral direction) and to be parallel to each other and (ii) vertical signal lines VL1 through VLM (first signal lines) which are provided to extend in a vertical direction (longitudinal direction) and to be parallel to each other. Electrostatic capacitances C11 through CMM are formed at respective intersections where the horizontal signal lines HL1 through HLM intersect the vertical signal lines VL1 through VLM.

The electrostatic capacitance value distribution detecting circuit 2 includes a multiplexer 4, a driving section 5, a sense signal processing section 6, an operation control section 7 (external noise removing or reducing section), a noise detecting section 8 (external noise determining section), a touch position detecting section 9, and a parameter storing section 10.

The driving section 5 sequentially supplies a driving signal to drive lines DL1 through DLM. Upon reception of the driving signal, the touch panel 3 outputs, via sense lines SL1 through SLM, electric charges corresponding to values of electrostatic capacitances.

The sense signal processing section 6 receives, via the sense lines SL1 through SLM, a sense signal corresponding to (i) the driving signal supplied to the touch panel 3 and (ii) the electrostatic capacitances. Specifically, the sense signal processing section 6 receives sense signals corresponding to values of the electrostatic capacitances formed at the respective intersections where the horizontal signal lines HL1 through HLM intersect the vertical signal lines VL1 through VLM. The sense signals received by the sense signal processing section 6 are signals having a signal intensity distribution corresponding to distribution of electrostatic capacitance values of the touch panel 3. The sense signal processing section 6 notifies the noise detecting section 8 of the distribution of the intensities of the sense signals.

Figure 3:
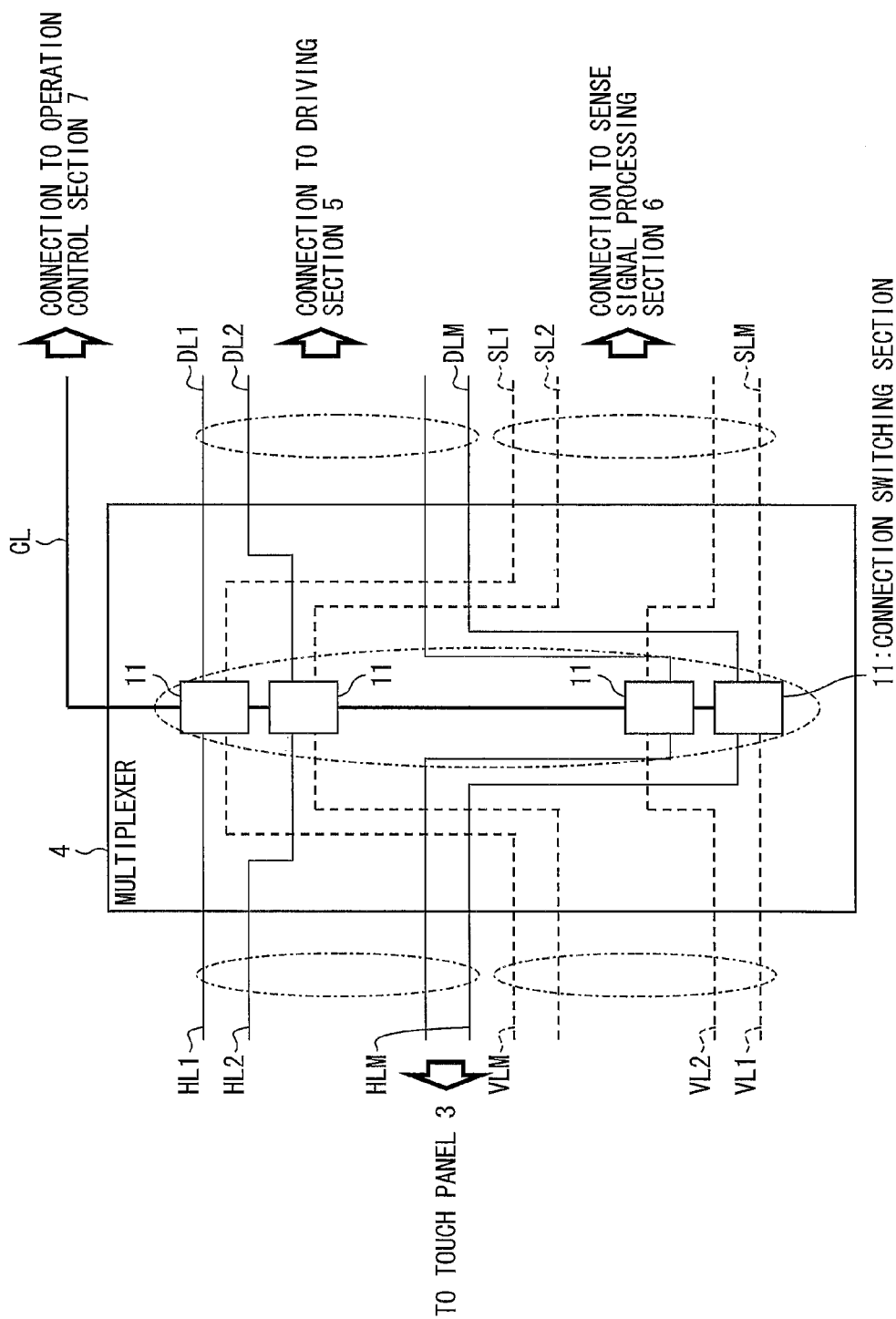
FIG. 3 is a circuit diagram schematically illustrating a configuration of a multiplexer of the embodiment of the present invention.

FIG. 3 is a circuit diagram schematically illustrating a configuration of the multiplexer 4. The multiplexer 4 includes M connection switching sections 11 which are connected in cascade. An initial one of the connection switching sections 11 is connected to a control line CL extending from the operation control section 7. The multiplexer 4 carries out a switching between a first connection state (first operation mode) and a second connection state (second operation mode) in response to a control signal supplied via the control line CL from the operation control section 7. Switching to the first connection state causes the vertical signal lines VL1 through VLM to be electrically connected to the respective drive lines DL1 through DLM of the driving section 5, and causes the horizontal signal lines HL1 through HLM to be electrically connected to the respective sense lines SL1 through SLM of the sense signal processing section 6. Switching to the second connection state causes the vertical signal lines VL1 through VLM to be electrically connected to the respective sense lines SL1 through SLM of the sense signal processing section 6, and causes the horizontal signal lines HL1 through HLM to be electrically connected to the respective drive lines DL1 through DLM of the driving section 5.

Figure 4:
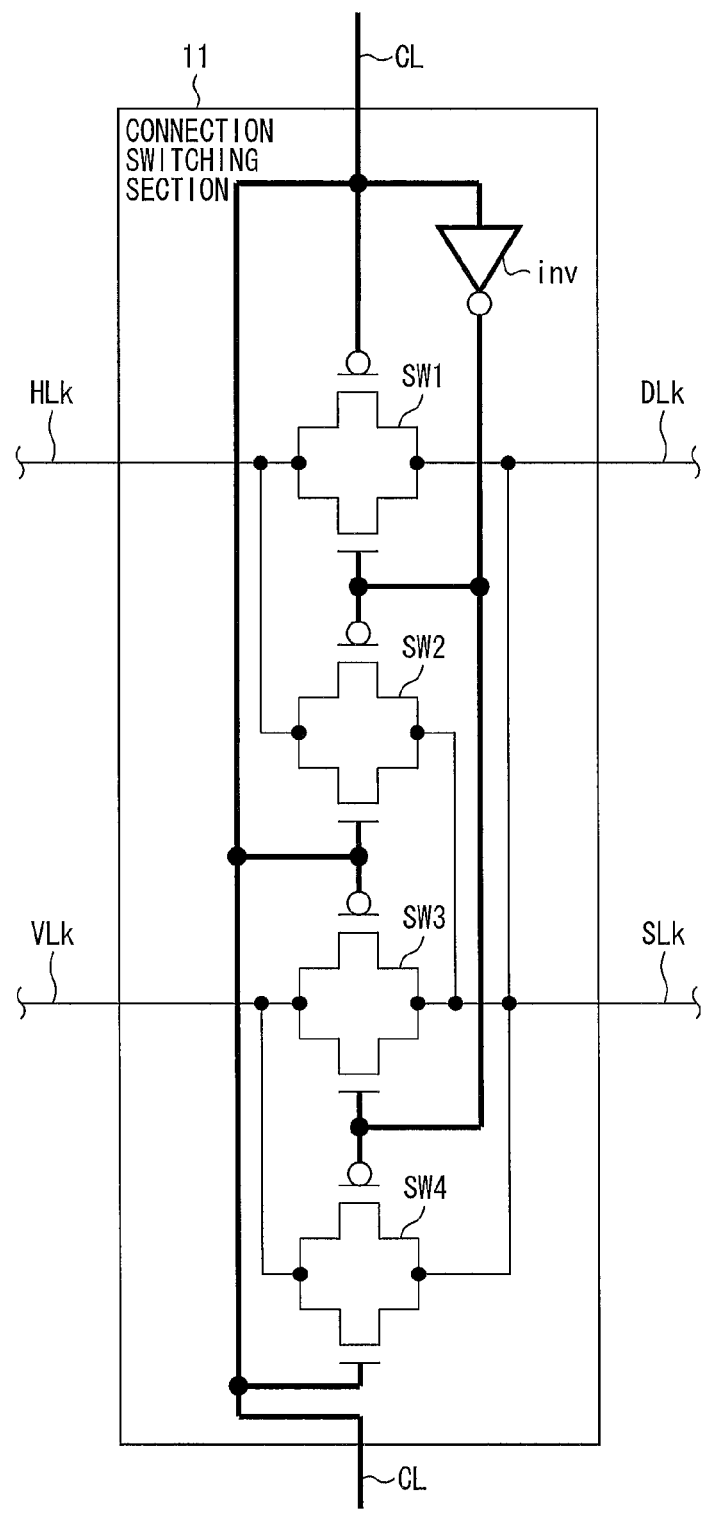
FIG. 4 is a circuit diagram illustrating in detail an example configuration of a connection switching section of the embodiment of the present invention.

FIG. 4 is a circuit diagram illustrating in detail an example configuration of a connection switching section 11. The connection switching section 11 includes four CMOS switches SW1 through SW4. The control line CL for the connection switching section 11 is connected to the control line CL for a previous connection switching section 11 and the control line CL for a subsequent connection switching section 11. That is, the M connection switching sections 11 share the control line CL from the operation control section 7. The control line CL is connected to (i) a control terminal of a p-type transistor of the CMOS switch SW1, (ii) a control terminal of an n-type transistor of the CMOS switch SW2, (iii) a control terminal of a p-type transistor of the CMOS switch SW3, (iv) a control terminal of an n-type transistor of the CMOS switch SW4, and (v) an input terminal of an inverter inv. An output terminal of the inverter inv is connected to (i) a control terminal of an n-type transistor of the CMOS switch SW1, (ii) a control terminal of a p-type transistor of the CMOS switch SW2, (iii) a control terminal of an n-type transistor of the CMOS switch SW3, and (iv) a control terminal of a p-type transistor of the CMOS switch SW4. A horizontal signal line HLk is connected to an end part of the CMOS switch SW1 and an end part of the CMOS switch SW2. A vertical signal line VLk is connected to an end part of the CMOS switch SW3 and an end part of the CMOS switch SW4. A drive line DLk is connected to another end part of the CMOS switch SW1 and another end part of the CMOS switch SW4. A sense line SLk is connected to another end part of the CMOS switch SW2 and another end part of the CMOS switch SW3. Note here that, for example, HLk represents a $k^{th}$ horizontal signal line ($1 \leq k \leq M$).

A control signal of the control line CL is caused to have a High level. This causes the horizontal signal lines HL1 through HLM to be electrically connected to the respective sense lines SL1 through SLM, and causes the vertical signal lines VL1 through VLM to be electrically connected to the respective drive lines DL1 through DLM (the first connection state). The control signal of the control line CL is caused to have a Low level. This causes the horizontal signal lines HL1 through HLM to be electrically connected to the respective drive lines DL1 through DLM, and causes the vertical signal lines VL1 through VLM to be electrically connected to the respective sense lines SL1 through SLM (the second connection state).

The operation control section 7 supplies, to the multiplexer 4, a control signal for instructing the multiplexer 4 on a connection state. The operation control section 7 generates (i) a signal which defines an operation of the driving section 5 and (ii) a signal which defines an operation of the sense signal processing section 6, and supplies these signals to the driving section 5 and the sense signal processing section 6, respectively.

The noise detecting section 8 determines, from a sense signal intensity distribution, whether or not external noise exists. A process carried out by the noise detecting section 8 will be specifically described later. The noise detecting section 8 notifies the touch position detecting section 9 of (i) a determination result of whether or not external noise exists and (ii) the sense signal intensity distribution. In this specification, electromagnetic noise which is gotten by a human body etc. and enters the touch sensor system via an indicator is called "external noise".

The touch position detecting section 9 specifies, from the sense signal intensity distribution, a touch position of an indicator.

The parameter storing section 10 stores a predetermined parameter which is used to determine whether or not external noise exists or to specify the touch position. The parameter is read by the noise detecting section 8 or the touch position detecting section 9.

(Outline of Noise Detection Method)

The following description will briefly describe how external noise affects a sense signal in a case where the external noise exists.

(a) and (b) of FIG. 5 are each a graph illustrating a sense signal intensity distribution in a case where external noise exists. (a) of FIG. 5 illustrates a sense signal intensity distribution in a case where (i) the vertical signal lines are electrically connected to the drive lines and (ii) the horizontal signal lines are electrically connected to the sense lines. In the graphs, a height represents an intensity of a sense signal. An intensity of a sense signal obtained from one of the horizontal signal lines (the sense lines) when a driving signal is supplied to one of the vertical signal lines (the drive lines) is plotted at an intersection where the one of the vertical signal lines intersects the one of the horizontal signal lines.

A peak at a center of (a) of FIG. 5 is of a sense signal due to a touch. In a case where external noise exists, small peaks are detected at positions other than a touched position. These small peaks are of sense signals due to the external noise, and appear in a sense line at the touched position.

(b) of FIG. 5 illustrates a sense signal intensity distribution in a case where (i) the horizontal signal lines are electrically connected to the drive lines and (ii) the vertical signal lines are electrically connected to the sense lines. In this case, peaks of sense signals due to external noise appear in a sense line at a touched position, too.

Note that, in addition to external noise that is electromagnetic noise which is gotten by a human body etc. and enters the touch panel device via an indicator, noise is caused by an indicator moving at high speed on the touch panel. This noise is called "phantom noise" in this specification. In a case where an indicator moves at high speed, a plurality of peaks of sense signals due to phantom noise appear in a sense line at a position touched by the indicator. In a case where phantom noise exists, sense signal intensity distributions similar to those illustrated in (a) and (b) of FIG. 5 are obtained.

It is possible to specify a touched position by comparing an intensity of a sense signal with a threshold. Increase in threshold so as not to erroneously detect noise as a touch deteriorates a touch detection sensitivity. Further, in order to detect a touch of a first indicator in synchronization with a touch of a second indicator which is greatly different in signal intensity from the first indicator, it is necessary to determine a plurality of thresholds or to determine a threshold so that it is possible to detect a touch of an indicator small in signal intensity. In both cases, noise is larger than the threshold(s). This causes noise to be erroneously detected as a touch. It is therefore difficult to correctly determine, only from an intensity of a sense signal, whether a peak is a peak due to noise or a peak due to a touch.

In order to solve the problem, the electrostatic capacitance value distribution detecting circuit 2 of Embodiment 1 utilizes a phenomenon that external noise appears in a sense line at a touched position. The electrostatic capacitance value distribution detecting circuit 2 detects whether or not external noise exists, by use of (i) a sense signal intensity distribution which is obtained in the first connection state and (ii) a sense signal intensity distribution which is obtained in the second connection state.

(a) of FIG. 6 is a view illustrating a region touched in the first connection state and a region where noise appears in the first connection state. (b) of FIG. 6 is a view illustrating a region touched in the second connection state and a region where noise appears in the second connection state. Note here that the vertical signal lines extend in an x direction, and the horizontal signal lines extend in a y direction. In a case where a region A is touched by an indicator in the first connection state (see (a) of FIG. 6), external noise appears in sense signals of sense lines (horizontal signal lines) which pass through the region A. Accordingly, the external noise appears in sense signals in a region B along the sense lines (horizontal signal lines) which pass through the region A. Similarly, in a case where the region A is touched by the indicator in the second connection state (see (b) of FIG. 6), external noise appears in sense signals of sense lines (vertical signal lines) which pass through the region A. Accordingly, the external noise appears in sense signals in a region C along the sense lines (vertical signal lines) which pass through the region A.

Note here that, in a case where a portion (intersection) where a signal intensity exceeds a predetermined signal threshold is present at a position other than the region A touched by the indicator, external noise is supposed to exist. The number of intersections where signal intensities exceed a signal threshold in the first connection state (the number of electrostatic capacitances) is counted as b. This b is considered to represent the number of intersections where signal intensities exceed the signal threshold in the region B (second detection region). The number of intersections where the signal intensities exceed the signal threshold is assumed to a threshold exceeding electrostatic capacitance number. Similarly, the number of intersections where signal intensities exceed the signal threshold in the second connection state is counted as c. This c is considered to represent the number of intersections where signal intensities exceed the signal threshold in the region C (first detection region). Assume that (i) a noise indicator is obtained by subtracting, from a sum of the b and the c, twice the number a of intersections in the region A and (ii) the number a of intersections in the region A is the number of electrostatic capacitances corresponding to a touch. In a case where the noise indicator (b+c−2×a) is larger than zero (0), an intersection where a signal intensity exceeds the signal threshold is supposed to be present at a position other than the region A touched by the indicator. That is, in the case where the noise indicator (b+c−2×a) is larger than 0, it is supposed that external noise exits. On the other hand, in a case where the noise indicator (b+c−2×a) is not larger than 0, it is supposed that no external noise exits.

(Details of Noise Detection Method)

FIG. 7 is a flowchart illustrating a flow of noise detection of Embodiment 1.

The operation control section 7 supplies a control signal to the multiplexer 4 via the control line CL at a first time. This changes the multiplexer 4 to be in the first connection state (ST1). In the first connection state, (i) the vertical signal lines VL1 through VLM are electrically connected to the respective drive lines DL1 through DLM of the driving section 5, and (ii) the horizontal signal lines HL1 through HLM are electrically connected to the respective sense lines SL1 through SLM of the sense signal processing section 6.

At a second time after the first time, (i) the driving section 5 supplies a driving signal to the drive lines DL1 through DLM, and (ii) the sense signal processing section 6 receives a sense signal via the sense lines SL1 through SLM (ST2). The sense signal is a signal corresponding to a value of an electronic capacitance at an intersection.

The noise detecting section 8 reads predetermined parameters (external parameters) NoiseTh and FingerWidthwithMargin from the parameter storing section 10.

The predetermined parameter NoiseTh is a signal threshold (detection threshold) for detecting a touched position and noise. That is, in a case where a signal intensity at an intersection exceeds the signal threshold NoiseTh, the intersection is probably being touched by an indicator. Note, however, that there is a case where the signal intensity exceeds the signal threshold NoiseTh due to external noise etc.

The predetermined parameter FingerWidthwithMargin represents an upper limit (first threshold, second threshold) of a width, in a vertical or horizontal direction, of a region of the touch panel 3 which region is touched by an indicator to be used (an upper limit of the number of intersections of the width). The upper limit FingerWidthwithMargin may be different between the vertical direction and the horizontal direction. In a case where an indicator to be used touches the touch panel 3 in a state where no external noise exists, it is supposed that a plurality of intersections where signal intensities exceed the signal threshold NoiseTh are found in the vertical and horizontal directions within the upper limit FingerWidthwithMargin. That is, in a case where no external noise exists, it can be predicted that widths, in the respective vertical and horizontal directions, of the region A (see FIG. 6) are not larger than the upper limit FingerWidthwithMargin.

The noise detecting section 8 finds, from an obtained sense signal intensity distribution, parameters NoiseIndicator(i), NoisyLineSet(first), NumNoisyLine(first), and NumNoise (first) in the first connection state (ST3).

Specifically, the noise detecting section 8 finds, for each of the sense lines, as the parameter NoiseIndicator(i), the number of intersections (electrostatic capacitances) where signal intensities (signal absolute values) exceed the signal threshold NoiseTh. The parameter NoiseIndicator(i) (a threshold exceeding electrostatic capacitance number) is a variable representing the number of intersections above an $i^{th}$ sense line at which intersections signal intensities (signal absolute values) exceed the signal threshold NoiseTh.

The parameter NoisyLineSet(first) is a set of sense lines which satisfy a relation of NoiseIndicator(i)>FingerWidthwithMargin in the first connection state. For example, in a case where the third through sixth sense lines satisfy the relation, the parameter NoisyLineSet(first) can be defined as an array that contains 3, 4, 5, and 6 as elements.

The parameter NumNoisyLine(first) is a variable representing the number of the elements of the set NoisyLineSet (first) in the first connection state. That is, the parameter NumNoisyLine(first) represents the number of sense lines (the number of second lines) which satisfy the relation of NoiseIndicator(i)>FingerWidthwithMargin.

The parameter NumNoise(first) is a variable representing a sum of parameters NoiseIndicator(i) of respective sense lines included in the set NoisyLineSet(first) in the first connection state. That is, the parameter NumNoise(first) is a sum (second sum) of parameters NoiseIndicator(i) of the respective sense lines which satisfy the relation of NoiseIndicator(i)>FingerWidthwithMargin.

The operation control section 7 supplies a control signal to the multiplexer 4 via the control line CL at a third time after the second time. This changes the multiplexer 4 to be in the second connection state (ST4). In the second connection state, (i) the vertical signal lines VL1 through VLM are electrically connected to the respective sense lines SL1 through SLM of the sense signal processing section 6, and (ii) the horizontal signal lines HL1 through HLM are electrically connected to the respective drive lines DL1 through DLM of the driving section 5.

At a fourth time after the third time, (i) the driving section 5 supplies a driving signal to the drive lines DL1 through DLM, and (ii) the sense signal processing section 6 receives a sense signal via the sense lines SL1 through SLM (ST5).

The noise detecting section 8 finds, from an obtained sense signal intensity distribution, parameters NoiseIndicator(i), NoisyLineSet(second), NumNoisyLine(second), and NumNoise(second) in the second connection state (ST6).

The parameter NoisyLineSet(second) is a set of sense lines which satisfy a relation of NoiseIndicator(i)>FingerWidthwithMargin in the second connection state.

The parameter NumNoisyLine(second) is a variable representing the number of elements of the set NoisyLineSet (second) in the second connection state. That is, the parameter NoisyLineSet(second) represents the number of sense lines (the number of first lines) which satisfy the relation of NoiseIndicator(i)>FingerWidthwithMargin.

The parameter NumNoise(second) is a variable representing a sum of parameters NoiseIndicator(i) of respective sense lines included in the set NoisyLineSet(second) in the second connection state. That is, the parameter NumNoise(second) is a sum (first sum) of parameters NoiseIndicator(i) of the respective sense lines which satisfy the relation of NoiseIndicator(i)>FingerWidthwithMargin.

The noise detecting section 8 finds a noise indicator NoiseMetric based on (i) the parameters in the first connection state and (ii) the parameters in the second connection state as follows.

$$\text{NoiseMetric} = \text{NumNoise(first)} + \text{NumNoise(second)} - 2 \times \text{NumNoisyLine(first)} \times \text{NumNoisyLine(second)}$$

It is supposed that increase in external noise increases the noise indicator NoiseMetric. In a case where NoiseMetric>0 (Yes in ST7), the noise detecting section 8 determines that external noise exists.

In a case where NoiseMetric≤0 (No in ST7), the noise detecting section 8 determines that no external noise exists. The noise detecting section 8 then notifies the touch position detecting section 9 of a determination result. The touch position detecting section 9 specifies a position touched by an indicator, on the basis of the sense signal intensity distribution which is obtained in the first connection state and/or the sense signal intensity distribution which is obtained in the second connection state (ST8).

In the case where NoiseMetric>0 (Yes in ST7), the noise detecting section 8 determines that external noise exists. The noise detecting section 8 then determines whether or not a noise determination process from ST1 to ST7 has been carried out predetermined number of times or more. Note that the noise detecting section 8 stores a noise indicator NoiseMetric and a signal intensity distribution corresponding to the noise indicator NoiseMetric.

In a case where the noise detecting section 8 determines that the noise determination process from ST1 to ST7 has been carried out the predetermined number of times or more (Yes in ST9), the noise detecting section 8 notifies the touch position detecting section 9 of a sense signal intensity distribution which is obtained when NoiseMetric is smallest among plural noise determination processes. It is supposed that external noise less affects as NoiseMetric is smaller. The touch position detecting section 9 specifies, on the basis of the sense signal intensity distribution notified by the noise detecting section 8, the position touched by the indicator (ST8). Note that the noise detecting section 8 (notifying section) may notify the touch position detecting section 9 or a device (host device) that uses the touch sensor system 1 of whether or not external noise exists.

In a case where the noise detecting section 8 determines that the noise determination process from ST1 to ST7 has been carried out less than the predetermined number of times (No in ST9), the noise detecting section 8 determines that external noise exists, and instructs the operation control section 7 to remove the external noise. The operation control section 7 changes an operation condition so as to remove the external noise (ST10). Specifically, the operation control section 7 changes, for example, a frequency of a driving signal so as to remove the external noise. Note that the external noise can be removed by another noise removal means. Subsequently, the electrostatic capacitance value distribution detecting circuit 2 repetitively carries out the noise determination process from ST1 to ST7 under the operation condition changed by the operation control section 7.

Note that, in the case where NoiseMetric>0, the noise detecting section 8 may warn a host that external noise exists, and then the touch position detecting section 9 may specify the position touched by the indicator. This warning may contain the noise indicator NoiseMetric. Since it is supposed that external noise less affects as NoiseMetric is smaller, the host can recognize how much the external noise affects.

FIG. 8 is a graph illustrating an example of noise indicators NoiseMetric for respective normally-completed plural noise determination processes. According to the example illustrated in FIG. 8, a change in operation condition under which noise is removed causes the noise indicator NoiseMetric to be 0 in the fourth noise determination process. The noise detecting section 8 employs a sense signal intensity distribution for the fourth noise determination process so that the touch position detecting section 9 detects a touched position on the basis of the sense signal intensity distribution.

FIG. 9 is a graph illustrating an example of noise indicators NoiseMetric for respective conditionally-completed plural noise determination processes. According to the example illustrated in FIG. 9, even a change in operation condition under which noise is removed causes none of the noise indicators NoiseMetric to be 0. The noise determination processes have been carried out predetermined number of times (6 times) and ended. In this case, the noise detecting section 8 employs a sense signal intensity distribution which is obtained when NoiseMetric is smallest (the fourth noise determination process) so that the touch position detecting section 9 detects a touched position on the basis of the sense signal intensity distribution. The operation control section 7 can be configured to remove noise under an operation condition of the fourth noise determination process where NoiseMetric is smallest.

According to Embodiment 1, the electrostatic capacitance value distribution detecting circuit 2 can detect that external noise exists, and can carry out a noise removal process in a case where the electrostatic capacitance value distribution detecting circuit 2 detects that external noise exists. Further, after the noise removal process, the electrostatic capacitance value distribution detecting circuit 2 can determine whether the external noise has been removed or sill remains. The electrostatic capacitance value distribution detecting circuit 2 can quantitatively find, as a noise indicator NoiseMetric, noise quantity of external noise contained in a signal. Therefore, the electrostatic capacitance value distribution detecting circuit 2 can select an optimal noise removal process so as to minimize the external noise.

FIG. 10 is an explanatory view explaining parameters. (a) of FIG. 10 is a graph illustrating distribution of intensities of sense signals at respective intersections. (b) of FIG. 10 is a graph illustrating distribution of intensities of sense signals of the $i^{th}$ sense line. In (b) of FIG. 10, NoiseTh represents a threshold of a signal intensity, and NoiseIndicator(i) represents the number of intersections where signal intensities (signal absolute values) exceed the threshold NoiseTh. In (a) of FIG. 10, NoisyLineSet represents a set of sense lines which satisfy the relation of NoiseIndicator(i)>FingerWidthwithMargin. In FIG. 10, {Ai, Aj, Ak} represent respective $i^{th}$ through $k^{th}$ sense lines, and NumNoisyLine represents the number of sense lines which satisfy the relation of NoiseIndicator(i)>FingerWidthwithMargin.

Specific Example 1 of Noise Detection

The following description will discuss a specific example of a noise determination process by using a touch panel that includes 21 vertical signal lines and 11 horizontal signal lines.

FIG. 11 is a table illustrating a specific example of a sense signal intensity distribution found in the first connection state. Similar to FIG. 11, FIG. 12 is a table illustrating a specific example of a sense signal intensity distribution found in the second connection state. Note here that a signal threshold NoiseTh is 100, and FingerWidthwithMargin is 7.

In the first connection state (see FIG. 11), (i) the vertical signal lines are electrically connected to drive lines, and (ii) the horizontal signal lines are electrically connected to sense lines. In FIG. 11, S0 through S10 represent respective reference numbers of the sense lines, and D0 through D20 represent respective reference numbers of the drive lines. In the first connection state, though signal intensities exceed the signal threshold NoiseTh (=100) at some intersections, the number of sense lines whose parameters NoiseIndicator(i) exceed FingerWidthwithMargin (=7) is 0 (see NoiseIndicator (i) of FIG. 11). Therefore, NumNoisyLine(first) and NumNoise(first) are 0.

In the second connection state (see FIG. 12), (i) the horizontal signal lines are electrically connected to the drive lines, and (ii) the vertical signal lines are electrically connected to the sense lines. In FIG. 12, S0 through S20 represent respective reference numbers of the sense lines, and D0 through D10 represent respective reference numbers of the drive lines. In the second connection state, though signal intensities exceed the signal threshold NoiseTh at some intersections, the number of sense lines whose parameters NoiseIndicator(i) exceed FingerWidthwithMargin (=7) is 0 (see NoiseIndicator(i) of FIG. 12). Therefore, NumNoisyLine(second) and NumNoise (second) are 0.

Accordingly, a noise indicator NoiseMetric is 0. Since the noise indicator NoiseMetric does not exceed 0, the noise detecting section 8 determines that no external noise exists in a case of FIGS. 11 and 12.

Specific Example 2 of Noise Detection

The following description will discuss a specific example of a noise determination process in a case where another intensity distribution is obtained.

FIG. 13 is a table illustrating a specific example of a sense signal intensity distribution found in the first connection state. Similar to FIG. 13, FIG. 14 is a table illustrating a specific example of a sense signal intensity distribution found in the second connection state. Note here that a signal threshold NoiseTh is 100, and FingerWidthwithMargin is 7.

In the first connection state (see FIG. 13), (i) the vertical signal lines are electrically connected to the drive lines, and (ii) the horizontal signal lines are electrically connected to the sense lines. NoiseIndicator(i) of FIG. 13 represents the number of intersections where signal intensities exceed the signal threshold NoiseTh (=100). In the first connection state, the number of sense lines whose parameters NoiseIndicator(i) exceed FingerWidthwithMargin (=7) is 4 (see NoiseIndicator (i) of FIG. 13). That is, NumNoisyLine(first)=4. Since NumNoise(first) is a sum of the parameters NoiseIndicator(i) of the four sense lines, NumNoise(first)=10+16+8+17=51.

In the second connection state (see FIG. 14), (i) the horizontal signal lines are electrically connected to the drive lines, and (ii) the vertical signal lines are electrically connected to the sense lines. NoiseIndicator(i) of FIG. 14 represents the number of intersections where signal intensities exceed the signal threshold NoiseTh (=100). In the second connection state, the number of sense lines whose parameters NoiseIndicator(i) exceed FingerWidthwithMargin (=7) is 2 (see NoiseIndicator(i) of FIG. 14). That is, NumNoisyLine(second)=2. Since NumNoise(second) is a sum of the parameters NoiseIndicator(i) of the two sense lines, NumNoise(second)= 10+9=19.

Accordingly, a noise indicator NoiseMetric of this case is 51+19−2×4×2=54. Since the noise indicator NoiseMetric exceeds 0, the noise detecting section 8 determines that external noise exists in a case of FIGS. 13 and 14.

Specific Example 3 of Noise Detection

The following description will discuss a specific example of a noise determination process in a case where yet another intensity distribution is obtained. Note here that what will be explained below is a state where two indicators simultaneously touch respective positions distant from each other.

FIG. 15 is a table illustrating a specific example of a sense signal intensity distribution found in the first connection state. Similar to FIG. 15, FIG. 16 is a table illustrating a specific example of a sense signal intensity distribution found in the second connection state. Note here that a signal threshold NoiseTh is 100, and FingerWidthwithMargin is 7.

In the first connection state (see FIG. 15), (i) the vertical signal lines are electrically connected to the drive lines, and (ii) the horizontal signal lines are electrically connected to the sense lines. Since the two indicators touch the touch panel, peak signal intensities are present in and around the drive line D5 and in and around the drive line D15 distant from the drive line D5, respectively. NoiseIndicator(i) of FIG. 15 represents the number of intersections where signal intensities exceed the signal threshold NoiseTh (=100). In the first connection state, the number of sense lines whose parameters NoiseIndicator(i) exceed FingerWidthwithMargin (=7) is 4 (see NoiseIndicator(i) of FIG. 15). That is, NumNoisyLine(first)= 4. Since NumNoise(first) is a sum of the parameters NoiseIndicator(i) of the four sense lines, NumNoise(first)= 11+17+8+18=54.

In the second connection state (see FIG. 16), (i) the horizontal signal lines are electrically connected to the drive lines, and (ii) the vertical signal lines are electrically connected to the sense lines. NoiseIndicator(i) of FIG. 16 represents the number of intersections where signal intensities exceeds the signal threshold NoiseTh (=100). In the second connection state, sense lines whose parameters NoiseIndicator(i) exceed FingerWidthwithMargin (=7) are the sense lines S5, S6, S17, and S18 (see NoiseIndicator(i) of FIG. 16). That is, the number of sense lines whose parameters NoiseIndicator(i) exceed FingerWidthwithMargin (=7) is 4 in total, i.e., NumNoisyLine(second)=4. Since NumNoise(second) is a sum of the parameters NoiseIndicator(i) of the four sense lines, NumNoise(second)=10+9+8+8=35.

Accordingly, a noise indicator NoiseMetric of this case is 54+35−2×4×4=57. Since the noise indicator NoiseMetric exceeds 0, the noise detecting section 8 determines that external noise exists in a case of FIGS. 15 and 16. As such, according to Embodiment 1, it is possible to determine whether or not external noise exists even in a case where a plurality of indicators simultaneously touch respective positions distant from each other.

(Modification)

Embodiment 1 has been described above on the basis of a configuration where a driving signal is sequentially supplied to the drive lines. Embodiment 1 is not limited to this. Embodiment 1 can be applied to a touch panel device configured so that (i) a plurality of driving signals are encoded and (ii) a plurality of drive lines are driven in parallel (see, for example, Patent Literature 4). Each of the plurality of driving signals has such pulses that the plurality of driving signals are orthogonal to each other (the plurality of driving signals are linearly independent signals or basis vectors). In this case, a signal outputted from a sense line is obtained as a linear sum of signals that correspond to a plurality of electrostatic capacitances (intersections). By decoding the signal outputted from the sense line through a predetermined operation, it is possible to obtain signals having respective signal intensities that correspond to values of the plurality of electrostatic capacitances.

The operation control section 7 may include a subsystem (external noise removing or reducing section) for removing external noise. Except for the above-described method of removing external noise by changing a frequency of a driving signal, various methods of removing or reducing external noise can be employed.

The following describes, for example, a case where a touch sensor system is configured to drive a plurality of drive lines in parallel. An operation control section 7 includes (i) a subsystem which performs, on a frame-by-frame basis, averaging on a plurality of linear sum signals based on the same vector driving and the same phase driving, (ii) a subsystem which performs, on a vector-by-vector basis, averaging, and (iii) a subsystem which performs, on a phase-by-phase basis, averaging. The operation control section 7 may be configured to select any of these subsystems so as to reduce external noise in accordance with a frequency characteristic between a normalization frequency and an amplitude change rate.

The operation control section 7 may further include a subsystem having a function of inverting a code of a driving signal when the averaging is performed on a vector-by-vector basis and on a phase-by-phase basis. In this case, the operation control section 7 may be configured to (i) include a subsystem which sets a period of driving and inversion to two phases and a subsystem which sets a period of driving and inversion to one phase and (ii) select any of these subsystems so as to reduce external noise in accordance with the frequency characteristic.

In the case where the operation control section 7 includes a subsystem having a driving and inversion function, the operation control section 7 may include a subsystem which reduces a reset time of a reset signal for resetting an amplifier circuit.

Embodiment 2

The following description will discuss Embodiment 2 of the present invention. For convenience, identical reference numerals are given to members having respective functions identical to those illustrated in the drawings of Embodiment 1, and descriptions of such members are omitted in Embodiment 2.

According to Embodiment 2, what is determined is not only whether or not external noise exists, the external noise being generated due to electromagnetic waves in a space, but also whether or not phantom noise exists, the phantom noise being generated due to an indicator moving at high speed on a touch panel. In a case where an indicator (finger) moves at high speed in touch with a touch panel 3 (see FIG. 25), phantom noise appears in a sense signal of a sense line that corresponds to a portion of the touch panel 3 which portion is touched by the indicator.

In a case where a phantom noise detection switch is in an ON state, a noise detecting section 8 of a touch sensor system 1 determines whether or not phantom noise exists. Information of whether the phantom noise detection switch is in the ON state or in an OFF state can be stored in a parameter storing section 10 etc. Embodiment 1 has described a case where a phantom noise detection switch is in the OFF state. The touch sensor system 1 of Embodiment 2 is identical in configuration to that of Embodiment 1, and therefore detailed description of the configuration of the touch sensor system 1 of Embodiment 2 will be omitted.

(Outline of Noise Detection Method)

The touch sensor system 1 of Embodiment 2 finds electrostatic capacitance values at respective intersections twice in the first connection state and twice in the second connection state.

FIGS. 17 and 18 are each a view illustrating a state where an indicator is moving at high speed in touch with the touch panel during a time period from a first frame to a fourth frame. In this state, phantom noise appears in a sense line that corresponds to a portion of the touch panel which portion is touched by the indicator, regardless of a direction in which the indicator moves. In FIGS. 17 and 18, D represents a region touched by the indicator which is moving. In FIGS. 17 and 18, the indicator is moving at high speed downward along a vertical signal line VL3.

(a) of FIG. 17 is a view illustrating a state at a first time (during a first frame). During the first frame, the touch sensor system 1 is in the first connection state. During the first frame, a driving signal is supplied via a vertical signal line VL, and a sense signal is outputted via a horizontal signal line HL. During the first frame, the indicator is present above horizontal signal lines HL6 and HL7 which are electrically connected to sense lines. A peak signal intensity due to a touch of the indicator is present in the horizontal signal lines HL6 and HL7. Therefore, phantom noise appears in sense signals of the horizontal signal lines HL6 and HL7.

At a second time after the first time, the touch sensor system 1 is changed to be in the second connection state from being in the first connection state.

(a) of FIG. 18 is a view illustrating a state at a third time (during a second frame). During the second frame, the touch sensor system 1 is in the second connection state. During the second frame, a driving signal is supplied via the horizontal signal line HL, and a sense signal is outputted via the vertical signal line VL. During the second frame, the indicator is present above a vertical signal line VL3 which is electrically connected to a sense line. A peak signal intensity due to the touch of the indicator is present in the vertical signal line VL3. Therefore, phantom noise appears in sense signals of the vertical signal line VL3.

At a fourth time after the third time, the touch sensor system 1 is changed to be in the first connection state from being in the second connection state.

(b) of FIG. 17 is a view illustrating a state at a fifth time (during a third frame). During the third frame, the touch sensor system 1 is in the first connection state. During the third frame, a driving signal is supplied via the vertical signal line VL, and a sense signal is outputted via the horizontal signal line HL. During the third frame, the indicator is present above horizontal signal lines HL8 and HL9 which are electrically connected to sense lines. A peak signal intensity due to the touch of the indicator is present in the horizontal signal lines HL8 and HL9. Therefore, phantom noise appears in sense signals of the horizontal signal lines HL8 and HL9. Since the indicator moves as time elapses, a signal line where phantom noise appears during the first frame differs from a signal line where phantom noise appears during the third frame.

At sixth time after the fifth time, the touch sensor system 1 is changed to be in the second connection state from being in the first connection state.

(b) of FIG. 18 is a view illustrating a state at a seventh time (during a fourth frame). During the fourth frame, the touch sensor system 1 is in the second connection state. During the fourth frame, a driving signal is supplied via the horizontal signal line HL, and a sense signal is outputted via the vertical signal line VL. During the fourth frame, the indicator is present above the vertical signal line VL3 which is electrically connected to the sense line. A peak signal intensity due to the touch of the indicator is present in the vertical signal line VL3. Therefore, phantom noise appears in sense signals of the vertical signal line VL3.

In a case where (i) a comparison of sense lines where noise appears is made between during the first frame during which the touch sensor system 1 is in the first connection state and during the third frame during which the touch sensor system 1 is in the first connection state and (ii) it is found as a result of the comparison that a shift in position of a sense line where the noise appears occurs, it is possible to determine that the noise is phantom noise. In a case where the indicator moves along a horizontal signal line, it is possible to find out a shift in position of a sense line where noise appears, by making a comparison of sense lines where noise appears between during the second frame during which the touch sensor system 1 is in the second connection state and during the fourth frame during which the touch sensor system 1 is in the second connection state.

(Details of Noise Detection Method)

FIG. 19 is a flowchart illustrating a flow of noise detection of Embodiment 2. The touch sensor system 1 of Embodiment 2 determines whether or not phantom noise and external noise exist.

At a $0^{th}$ time, an operation control section 7 supplies a control signal to a multiplexer 4 via a control line CL. This changes the multiplexer 4 to be in the first connection state (ST21). In the first connection state, vertical signal lines VL1 through VLM are electrically connected to respective drive lines DL1 through DLM of a driving section 5, and horizontal signal lines HL1 through HLM are electrically connected to respective sense lines SL1 through SLM of a sense signal processing section 6.

At a first time (during a first frame) after the $0^{th}$ time, (i) the driving section 5 supplies a driving signal to the drive lines DL1 through DLM, and (ii) the sense signal processing section 6 receives a sense signal via the sense lines SL1 through SLM. The noise detecting section 8 reads predetermined parameters (external parameters) NoiseTh and FingerWidthwithMargin from the parameter storing section 10. The noise detecting section 8 finds, from an obtained sense signal intensity distribution, parameters NoiseIndicator(i), NoisyLineSet (first), NumNoisyLine(first), and NumNoise(first) for the first frame (in the first connection state) (ST22).

The parameter NoiseIndicator(i) is a variable representing the number of intersections above an $i^{th}$ sense line at which intersections signal intensities (signal absolute values) exceed the signal threshold NoiseTh during the first frame.

The parameter NoisyLineSet(first) is a set of sense lines which satisfy a relation of NoiseIndicator(i)>FingerWidthwithMargin during the first frame. Since external noise and phantom noise appear in a sense line at a position touched by an indicator, it is supposed that the set NoisyLineSet(first) includes a sense line at a position of a peak signal intensity due to the touch of the indicator during the first frame.

The parameter NumNoisyLine(first) is a variable representing the number of elements of the set NoisyLineSet(first) for the first frame. That is, the parameter NumNoisyLine(first) represents the number of sense lines which satisfy the relation of NoiseIndicator(i)>FingerWidthwithMargin.

The parameter NumNoise(first) is a variable representing a sum of parameters NoiseIndicator(i) of respective sense lines included in the set NoisyLineSet(first) during the first frame. That is, the parameter NumNoise(first) is a sum of parameters NoiseIndicator(i) of the respective sense lines which satisfy the relation of NoiseIndicator(i)>FingerWidthwithMargin.

At a second time after the first time, the operation control section 7 supplies a control signal to the multiplexer 4 via the control line CL. This changes the multiplexer 4 to be in the second connection state (ST23). In the second connection state, (i) the vertical signal lines VL1 through VLM are electrically connected to the respective sense lines SL1 through SLM of the sense signal processing section 6, and (ii) the horizontal signal lines HL1 through HLM are electrically connected to the respective drive lines DL1 through DLM of the driving section 5.

At a third time (during a second frame) after the second time, (i) the driving section 5 supplies a driving signal to the drive lines DL1 through DLM, and (ii) the sense signal processing section 6 receives a sense signal via the sense lines SL1 through SLM. The noise detecting section 8 finds, from an obtained sense signal intensity distribution, parameters NoiseIndicator(i), NoisyLineSet(second), NumNoisyLine(second), and NumNoise(second) for the second frame (in the second connection state) (ST24).

The parameter NoiseIndicator(i) is a variable representing the number of intersections above the $i^{th}$ sense line at which intersections signal intensities (signal absolute values) exceed the signal threshold NoiseTh during the second frame.

The parameter NoisyLineSet(second) is a set of sense lines which satisfy a relation of NoiseIndicator(i)>FingerWidthwithMargin during the second frame. It is supposed that the set NoisyLineSet(second) includes a sense line at a position of a peak signal intensity due to the touch of the indicator during the second frame.

The parameter NumNoisyLine(second) is a variable representing the number of elements of the set NoisyLineSet(second) for the second frame. That is, the parameter NoisyLineSet(second) represents the number of sense lines which satisfy the relation of NoiseIndicator(i)>FingerWidthwithMargin.

The parameter NumNoise(second) is a variable representing a sum of parameters NoiseIndicator(i) of respective sense lines included in the set NoisyLineSet(second) during the second frame. That is, the parameter NumNoise(second) is a sum of parameters NoiseIndicator(i) of the respective sense lines which satisfy the relation of NoiseIndicator(i)>FingerWidthwithMargin.

At a fourth time after the third time, the operation control section 7 supplies a control signal to the multiplexer 4 via the control line CL. This changes the multiplexer 4 to be in the first connection state (ST25).

At a fifth time (during a third frame) after the fourth time, (i) the driving section 5 supplies a driving signal to the drive lines DL1 through DLM, and (ii) the sense signal processing section 6 receives a sense signal via the sense lines SL1 through SLM. The noise detecting section 8 finds, from an obtained sense signal intensity distribution, parameters NoiseIndicator(i), NoisyLineSet(third), NumNoisyLine(third), and NumNoise(third) for the third frame (in the first connection state) (ST26).

The parameter NoiseIndicator(i) is a variable representing the number of intersections above the $i^{th}$ sense line at which intersections signal intensities (signal absolute values) exceed the signal threshold NoiseTh during the third frame.

The parameter NoisyLineSet(third) is a set of sense lines which satisfy a relation of NoiseIndicator(i)>FingerWidthwithMargin during the third frame. It is supposed that the set NoisyLineSet(third) includes a sense line at a position of a peak signal intensity due to the touch of the indicator during the third frame.

The parameter NumNoisyLine(third) is a variable representing the number of elements of the set NoisyLineSet(third) for the third frame. That is, the parameter NumNoisyLine(third) represents the number of sense lines which satisfy the relation of NoiseIndicator(i)>FingerWidthwithMargin.

The parameter NumNoise(third) is a variable representing a sum of parameters NoiseIndicator(i) of respective sense lines included in the set NoisyLineSet(third) during the third frame. That is, the parameter NumNoise(third) is a sum of parameters NoiseIndicator(i) of the respective sense lines which satisfy the relation of NoiseIndicator(i)>FingerWidthwithMargin.

At a sixth time after the fifth time, the operation control section 7 supplies a control signal to the multiplexer 4 via the control line CL. This changes the multiplexer 4 to be in the second connection state (ST27).

At a seventh time (during a fourth frame) after the sixth time, (i) the driving section 5 supplies a driving signal to the drive lines DL1 through DLM, and (ii) the sense signal processing section 6 receives a sense signal via the sense lines SL1 through SLM. The noise detecting section 8 finds, from an obtained sense signal intensity distribution, parameters NoiseIndicator(i), NoisyLineSet(fourth), NumNoisyLine(fourth), and NumNoise(fourth) for the fourth frame (in the second connection state) (ST28).

The parameter NoiseIndicator(i) is a variable representing the number of intersections above the $i^{th}$ sense line at which intersections signal intensities (signal absolute values) exceed the signal threshold NoiseTh during the fourth frame.

The parameter NoisyLineSet(fourth) is a set of sense lines which satisfy a relation of NoiseIndicator(i)>FingerWidthwithMargin during the fourth frame. It is supposed that the set NoisyLineSet(fourth) includes a sense line at a position of a peak signal intensity due to the touch of the indicator during the fourth frame.

The parameter NumNoisyLine(fourth) is a variable representing the number of elements of the set NoisyLineSet(fourth) for the fourth frame. That is, the parameter NoisyLineSet(fourth) represents the number of sense lines which satisfy the relation of NoiseIndicator(i)>FingerWidthwithMargin.

The parameter NumNoise(fourth) is a variable representing a sum of parameters NoiseIndicator(i) of respective sense lines included in the set NoisyLineSet(fourth) during the fourth frame. That is, the parameter NumNoise(fourth) is a sum of parameters NoiseIndicator(i) of the respective sense lines which satisfy the relation of NoiseIndicator(i)>FingerWidthwithMargin.

The noise detecting section 8 reads a predetermined parameter (external parameter) MoveTh from the parameter storing section 10. The parameter MoveTh is a threshold of a shift amount of a position of a sense line.

The noise detecting section 8 compares (i) the set NoisyLineSet(first) for the first frame in the first connection state with (ii) the set NoisyLineSet(third) for the third frame in the first connection state. From the comparison, the noise detecting section 8 finds a shift amount of a position of a sense line where noise is supposed to appear between the first frame and the third frame. Similarly, the noise detecting section 8 compares (i) the set NoisyLineSet(second) for the second frame in the second connection state with (ii) the set NoisyLineSet(fourth) for the fourth frame in the second connection state. From the comparison, the noise detecting section 8 finds a shift amount of a position of a sense line where noise is supposed to appear between the second frame and the fourth frame (ST29).

Note that a set NoisyLineSet includes a sense line for which the number of intersections where signal intensities (signal absolute values) exceed the signal threshold NoiseTh exceeds the threshold FingerWidthwithMargin. That is, above the sense line included in the set NoisyLineSet present are many intersections where signal intensities are high. The sense line included in the set NoisyLineSet is a sense line where noise probably exists.

The noise detecting section 8 (phantom noise determining section) determines that phantom noise exists in a case where (i) the shift amount of the position of the sense line between the first frame and the third frame or (ii) the shift amount of the position of the sense line between the second frame and the fourth frame exceeds the threshold MoveTh (Yes in ST30). In a case where the noise detecting section 8 determines that phantom noise exists, the noise detecting section 8 notifies a host device that phantom noise exists (ST31), and completes a process. After the process, the touch sensor system 1 may carry out a sensing process of ST21 and later again after a predetermined time elapses in order to prevent phantom noise from appearing.

The noise detecting section 8 carries out an external noise determination process of ST32 and later in a case where (i) the shift amount of the position of the sense line between the first frame and the third frame and (ii) the shift amount of the position of the sense line between the second frame and the fourth frame are not larger than the threshold MoveTh (No in ST30).

The noise detecting section 8 finds a noise indicator NoiseMetric from the parameters in the first connection state and the parameters in the second connection state. Specifically, the noise detecting section 8 finds a first noise indicator NoiseMetric from the parameters for the first frame and the parameters for the second frame, finds a second noise indicator NoiseMetric from the parameters for the second frame and the parameters for the third frame, and finds a third noise indicator NoiseMetric from the parameters for the third frame and the parameters for the fourth frame (ST32). Since two continuous frames differ in connection state from each other, the noise detecting section 8 can find a plurality of noise indicators.

In a case where any one of the noise indicators NoiseMetric is larger than 0 (Yes in ST33), the noise detecting section 8 determines that external noise exists.

In a case where all of the noise indicators NoiseMetric are not larger than 0 (No in ST33), the noise detecting section 8 determines that no external noise exists, and notifies the touch position detecting section 9 of a determination result. The touch position detecting section 9 specifies, on the basis of a sense signal intensity distribution for any one of the frames, the position touched by the indicator (ST34).

In the case where any one of the noise indicators NoiseMetric is larger than 0 (Yes in ST33), the noise detecting section 8 determines that external noise exists. The noise detecting section 8 then determines whether or not a noise determination process of ST21 and later has been carried out predetermined number of times or more. Note that the noise detecting section 8 stores a noise indicator NoiseMetric and a signal intensity distribution corresponding to the noise indicator NoiseMetric.

In a case where the noise detecting section 8 determines that the noise determination process of ST21 and later has been carried out the predetermined number of times or more (Yes in ST35), the noise detecting section 8 notifies the touch position detecting section 9 of a sense signal intensity distribution which is obtained when NoiseMetric is smallest among plural noise determination processes. It is supposed that external noise less affects as NoiseMetric is smaller. The touch position detecting section 9 specifies, on the basis of the sense signal intensity distribution notified by the noise detecting section 8, the position touched by the indicator (ST34).

In a case where the noise detecting section 8 determines that the noise determination process of ST21 and later has been carried out less than the predetermined number of times (No in ST35), the noise detecting section 8 determines that external noise exists, and instructs the operation control section 7 to remove the external noise. The operation control section 7 changes an operation condition so as to remove the external noise (ST36). Specifically, the operation control section 7 changes, for example, a frequency of a driving signal so as to remove the external noise. Note that the external noise can be removed by another noise removal means. Subsequently, an electrostatic capacitance value distribution detecting circuit 2 repetitively carries out the noise determination process of ST21 and later under the operation condition changed by the operation control section 7.

Note that, in the case where any one of the noise indicators NoiseMetric is larger than 0, the noise detecting section 8 may warn a host that external noise exists, and then the touch position detecting section 9 may specify the position touched by the indicator. This warning may contain a noise indicator NoiseMetric. Since it is supposed that external noise less affects as NoiseMetric is smaller, the host can recognize how much the external noise affects.

Note that, though the above example has described a case where the noise detecting section 8 finds the plurality of noise indicators NoiseMetric, the noise detecting section 8 may find only one noise indicator NoiseMetric for two frames, and use the noise indicator NoiseMetric to determine whether or not external noise exists.

According to Embodiment 2, the electrostatic capacitance value distribution detecting circuit 2 can determine whether or not phantom noise exists. In addition, the electrostatic capacitance value distribution detecting circuit 2 can distinguish external noise from phantom noise, the external noise and the phantom noise differing in cause from each other. Therefore, the electrostatic capacitance value distribution detecting circuit 2 can carry out an appropriate process (e.g., a noise removal process) in accordance with whether noise is external noise or phantom noise.

Specific Example 4 of Noise Detection

The following description will discuss a specific example of a noise determination process by using a touch panel that includes 21 vertical signal lines and 11 horizontal signal lines.

FIG. 20 is a table illustrating a specific example of a sense signal intensity distribution found during a first frame (in a first connection state). FIG. 21 is a table illustrating a specific example of a sense signal intensity distribution found during a second frame (in a second connection state). FIG. 22 is a table illustrating a specific example of a sense signal intensity distribution found during a third frame (in the first connection state). FIG. 23 is a table illustrating a specific example of a sense signal intensity distribution found during a fourth frame (in the second connection state). Note here that a signal threshold NoiseTh is 100, FingerWidthwithMargin is 7, and a threshold MoveTh is 1.

During the first frame (see FIG. 20), (i) the vertical signal lines are electrically connected to drive lines, and (ii) the horizontal signal lines are electrically connected to sense lines. In FIG. 20, S0 through S10 represent respective reference numbers of the sense lines, and D0 through D20 represent respective reference numbers of the drive lines. NoiseIndicator(i) of FIG. 20 represents the number of intersections where signal intensities exceed the signal threshold NoiseTh (=100). During the first frame, the number of sense lines whose parameters NoiseIndicator(i) exceed FingerWidthwithMargin (=7) is 4 (see NoiseIndicator(i) of FIG. 20). A set NoisyLineSet(first)={S3, S4, S5, S6}. That is, NumNoisyLine(first)=4. Since NumNoise(first) is a sum of the parameters NoiseIndicator(i) of the four sense lines, NumNoise(first)=10+16+8+17=51.

During the second frame (see FIG. 21), (i) the horizontal signal lines are electrically connected to the drive lines, and (ii) the vertical signal lines are electrically connected to the sense lines. NoiseIndicator(i) of FIG. 21 represents the number of intersections where signal intensities exceed the signal threshold NoiseTh (=100). During the second frame, the number of sense lines whose parameters NoiseIndicator(i) exceed FingerWidthwithMargin (=7) is 2 (see NoiseIndicator(i) of FIG. 21). A set NoisyLineSet(second)={S6, S7}. That is, NumNoisyLine(second)=2. Since NumNoise(second) is a sum of the parameters NoiseIndicator(i) of the two sense lines, NumNoise(second)=10+9=19.

During the third frame (see FIG. 22), (i) the vertical signal lines are electrically connected to the drive lines, and (ii) the horizontal signal lines are electrically connected to the sense lines. NoiseIndicator(i) of FIG. 22 represents the number of intersections where signal intensities exceed the signal threshold NoiseTh (=100). During the third frame, the number of sense lines whose parameters NoiseIndicator(i) exceed FingerWidthwithMargin (=7) is 4 (see NoiseIndicator(i) of FIG. 22). A set NoisyLineSet(third)={S3, S4, S5, S6}. That is, NumNoisyLine(third)=4. Since NumNoise(third) is a sum of the parameters NoiseIndicator(i) of the four sense lines, NumNoise(third)=10+16+8+17=51.

During the fourth frame (see FIG. 23), (i) the horizontal signal lines are electrically connected to the drive lines, and (ii) the vertical signal lines are electrically connected to the sense lines. NoiseIndicator(i) of FIG. 23 represents the number of intersections where signal intensities exceed the signal threshold NoiseTh (=100). During the fourth frame, the number of sense lines whose parameters NoiseIndicator(i) exceed FingerWidthwithMargin (=7) is 2 (see NoiseIndicator(i) of FIG. 23). A set NoisyLineSet(fourth)={S8, S9}. That is, NumNoisyLine(fourth)=2. Since NumNoise(fourth) is a sum of the parameters NoiseIndicator(i) of the two sense lines, NumNoise(fourth)=10+9=19.

Since the set NoisyLineSet(first) for the first frame is the same as the set NoisyLineSet(third) for the third frame, a shift amount of a position of a sense line between the first frame and the third frame is 0. The set NoisyLineSet(second)={S6, S7} for the second frame is different from the set NoisyLineSet(fourth)={S6, S7} for the fourth frame by two sense lines. That is, a shift amount of a position of a sense line between the second frame and the fourth frame is 2. Since the shift amount of the position of the sense line between the second frame and the fourth frame exceeds the threshold MoveTh (=1), the noise detecting section 8 determines that phantom noise exists in a case of FIGS. 20 through 23.

Embodiment 3

The following description will discuss Embodiment 3 of the present invention. For convenience, identical reference numerals are given to members having respective functions identical to those illustrated in the drawings of Embodiments 1 and 2, and descriptions of such members are omitted in Embodiment 3. Embodiment 3 will describe a mobile phone 100 as an example of an electronic device including the touch sensor system 1 of Embodiment 1.

(Configuration of Mobile Phone 100)

FIG. 24 is a block diagram illustrating a configuration of the mobile phone 100 of Embodiment 3. FIG. 25 is a view illustrating an appearance of the mobile phone 100.

The mobile phone 100 (smart phone) includes a CPU 110, a RAM 112, a ROM 111, a camera 113, a microphone 114, a speaker 115, an operation key 116, a display panel 118, a display control circuit 109, and the touch sensor system 1. These components are connected to each other via a data bus.

The CPU 110 controls an operation of the mobile phone 100. The CPU 110 executes a program stored in the ROM 111 etc. A user gives an instruction to the mobile phone 100 via the operation key 116. The RAM 112 stores in a volatile manner (i) data generated by the CPU 110 executing the program or (ii) data entered via the operation key 116. The ROM 111 stores data in an involatile manner.

The ROM 111 is a ROM, such as an EPROM (Erasable Programmable Read-Only Memory) or a flash memory, in/from which data can be written or deleted. The mobile phone 100 may be configured to include an interface (IF) (not illustrated in FIG. 24) via which the mobile phone 100 is connected to another electronic device with a wire.

The camera 113 captures an image of a target in accordance with a user's operation of the operation key 116. Note that data of the captured image of the target is stored in the RAM 112 or in an external memory (e.g., a memory card). The microphone 114 receives audio from a user. The mobile phone 100 digitizes the audio (analog data), and transmits the digitized audio to a target (such as other mobile phone). The speaker 115 produces sounds based on data such as music data stored in the RAM 112.

The touch sensor system 1 includes the touch panel 3 and the electrostatic capacitance value distribution detecting circuit 2.

The display control circuit 109 controls the display panel 118 to display an image stored in the ROM 111 or in the RAM 112. The display panel 118 may overlap the touch panel 3 or may incorporate the touch panel 3.

[Summary]

An electrostatic capacitance value distribution detecting device of an aspect of the present invention is configured to be an electrostatic capacitance value distribution detecting device for detecting distribution of values of a plurality of electrostatic capacitances that are formed at respective intersections where a plurality of first signal lines (vertical signal lines VL) intersect a plurality of second signal lines (horizontal signal lines HL), the electrostatic capacitance value distribution detecting device detecting the distribution by (i) driving the plurality of first signal lines at a first time to output, from the plurality of second signal lines, electric charges corresponding to the plurality of electrostatic capacitances, (ii) switching connection of the plurality of first and second signal lines at a second time after the first time, and (iii) driving the plurality of second signal lines at a third time after the second time to output, from the plurality of first signal lines, electric charges corresponding to the plurality of electrostatic capacitances, the electrostatic capacitance value distribution detecting device including an external noise determining section (noise detecting section 8) which determines whether or not external noise exists, the external noise being generated via a touching indicator along a direction in which the electric charges are outputted.

According to the configuration, the electrostatic capacitance value distribution detecting device which detects the distribution of the values of the plurality of electrostatic capacitances can determine whether or not external noise, that is electromagnetic noise which is gotten by a human body etc. and enters a touch panel device via an indicator, exist.

It can be further configured so that, in a case where the number of electrostatic capacitances where signals corresponding to the values exceed a detection threshold is a threshold exceeding electrostatic capacitance number, the external noise determining section determines whether or not the external noise exists, on the basis of (i) a first threshold exceeding electrostatic capacitance number of a first detection region along one of the plurality of first signal lines and (ii) a second threshold exceeding electrostatic capacitance number of a second detection region along one of the plurality of second signal lines.

According to the configuration, it is possible to determine whether or not external noise exists, on the basis of the number of electrostatic capacitances where signals exceed the detection threshold.

It can be further configured so that the external noise determining section detects the second threshold exceeding electrostatic capacitance number from signals corresponding to the values which are obtained at the first time, and detects the first threshold exceeding electrostatic capacitance number from signals corresponding to the values which are obtained at the third time.

It can be further configured so that the external noise determining section finds, for each of the plurality of second signal lines, as the second threshold exceeding electrostatic capacitance number, from signals corresponding to the values which are obtained at the first time, the number of electrostatic capacitances which exceed the detection threshold, the external noise determining section finds, as the number of second lines, the number of ones of the plurality of second signal lines each of which has the second threshold exceeding electrostatic capacitance number that exceeds a second threshold, the external noise determining section finds, as a second sum, a sum of second threshold exceeding electrostatic capacitance numbers of the respective ones of the plurality of second signal lines each of which ones has the second threshold exceeding electrostatic capacitance number that exceeds the second threshold, the external noise determining section finds, for each of the plurality of first signal lines, as the first threshold exceeding electrostatic capacitance number, from signals corresponding to the values which are obtained at the third time, the number of electrostatic capacitances which exceed the detection threshold, the external noise determining section finds, as the number of first lines, the number of ones of the plurality of first signal lines each of which ones has the first threshold exceeding electrostatic capacitance number that exceeds a first threshold, the external noise determining section finds, as a first sum, a sum of first threshold exceeding electrostatic capacitance numbers of the respective ones of the plurality of first signal lines each of which ones has the first threshold exceeding electrostatic capacitance number that exceeds the first threshold, and the external noise determining section determines whether or not the external noise exists, on the basis of the first sum, the second sum, the number of first lines, and the number of second lines.

According to the configuration, it is possible to determine whether or not external noise exists, on the basis of the number of electrostatic capacitances which exceed the detection threshold.

It can be further configured so that the external noise determining section finds, as a noise indicator, a value obtained by subtracting, from a sum of the first sum and the second sum, twice as large as a product of the number of first lines multiplied by the number of second lines, and in a case where the noise indicator is larger than 0, the external noise determining section determines that the external noise has been generated.

According to the configuration, the number of signals due to external noise can be represented by the noise indicator from (i) the signals due to the external noise and (ii) a signal(s) due to a touch of an indicator. This makes it possible to correctly determine from the noise indicator whether or not external noise exists.

It can be further configured so that the external noise determining section finds, as a noise indicator, a value obtained by subtracting, from a sum of the first sum and the second sum, twice as large as a product of the number of first lines multiplied by the number of second lines, and in a case where the noise indicator is not larger than 0, the external noise determining section determines that the external noise has not been generated.

The electrostatic capacitance value distribution detecting device can be further configured to further include an external noise removing or reducing section (operation control section 7) which removes or reduces the external noise according to a determination result brought by the external noise determining section, and after the external noise removing or reducing section carries out an external noise removing or reducing process, the external noise determining section determining whether or not the external noise exists.

The electrostatic capacitance value distribution detecting device can be further configured to further include a notifying section (noise detecting section 8) which notifies a host device of a determination result brought by the external noise determining section.

It can be further configured so that the external noise determining section finds and stores noise quantity of the external noise, and the external noise removing or reducing section removes or reduces the external noise under a condition where the noise quantity stored in the external noise determining section is a minimum noise quantity.

According to the configuration, the external noise removing or reducing section can appropriately remove or reduce external noise in accordance with noise quantity of the external noise.

The electrostatic capacitance value distribution detecting device can be further configured to further include a phantom noise determining section (noise detecting section 8) which determines whether or not phantom noise exists, the phantom noise being generated, due to a touch of an indicator which moves at high speed, along the direction in which the electric charges are outputted.

According to the configuration, it is possible to further determine whether or not phantom noise exists, the phantom noise differing in cause from external noise.

It can be further configured so that the electrostatic capacitance value distribution detecting device (i) switches the connection of the plurality of first and second signal lines at a fourth time after the third time, and (ii) drives the plurality of first signal lines at a fifth time after the fourth time to output, from the plurality of second signal lines, the electric charges corresponding to the plurality of electrostatic capacitances, in a case where the number of electrostatic capacitances where signals corresponding to the values exceed a detection threshold is a threshold exceeding electrostatic capacitance number, the external noise determining section determines whether or not the external noise exists, on the basis of (i) a first threshold exceeding electrostatic capacitance number of a first detection region along one of the plurality of first signal lines and (ii) a second threshold exceeding electrostatic capacitance number of a second detection region along one of the plurality of second signal lines, the external noise determining section detects the second threshold exceeding electrostatic capacitance number at the first time, and detects the first threshold exceeding electrostatic capacitance number at the third time, and the phantom noise determining section detects a position, along the plurality of second signal lines, of a peak of signals corresponding to the values which are obtained at the first time, and detects a position, along the plurality of second signal lines, of a peak of signals corresponding to the values which are obtained at the fifth time.

It can be further configured so that the electrostatic capacitance value distribution detecting device (i) switches the connection of the plurality of first and second signal lines at a sixth time after the fifth time, and (ii) drives the plurality of second signal lines at a seventh time after the sixth time to output, from the plurality of first signal lines, the electric charges corresponding to the plurality of electrostatic capacitances, and the external noise determining section detects the second threshold exceeding electrostatic capacitance number at the fifth time, and detects the first threshold exceeding electrostatic capacitance number at the seventh time.

It can be further configured so that the electrostatic capacitance value distribution detecting device (i) switches the connection of the plurality of first and second signal lines at a sixth time after the fifth time, and (ii) drives the plurality of second signal lines at a seventh time after the sixth time to output, from the plurality of first signal lines, the electric charges corresponding to the plurality of electrostatic capacitances, and the phantom noise determining section determines whether or not the phantom noise exists, on the basis of a first determination result and a second determination result, the first determination result being obtained by detecting (i) the position, along the plurality of second signal lines, of the peak of the signals corresponding to the values which are obtained at the first time and (ii) the position, along the plurality of second signal lines, of the peak of the signals corresponding to the values which are obtained at the fifth time, and the second determination result being obtained by detecting (i) a position, along the plurality of first signal lines, of a peak of signals corresponding to the values which are obtained at the third time and (ii) a position, along the plurality of first signal lines, of a peak of signals corresponding to the values which are obtained at the seventh time.

According to the configuration, whether or not phantom noise exits can be determined according to a determination result obtained based on (i) a position of a peak of signals corresponding to electrostatic capacitance values obtained at one time and (ii) a position of a peak of signals corresponding to the electrostatic capacitance values which are obtained at another time. This makes it possible to distinguish the phantom noise from external noise.

The electrostatic capacitance value distribution detecting device can be further configured to further include a notifying section which notifies a host device of a determination result brought by the phantom noise determining section.

The electrostatic capacitance value distribution detecting device can be further configured to complete an external noise removing or reducing process according to a determination result brought by the phantom noise determining section.

According to the configuration, external noise can be distinguished from phantom noise. It is therefore possible to prevent an inappropriate process from being carried out, for example, carrying out the external noise removing or reducing process in a case where phantom noise exist.

It can be further configured so that the external noise determining section determines whether or not the external noise exists, on the basis of (i) a first determination result based on a detection result at the first time and a detection result at the third time, (ii) a second determination result based on the detection result at the third time and a detection result at the fifth time, and (iii) a third determination result based on the detection result at the fifth time and a detection result at the seventh time.

An electrostatic capacitance value distribution detecting device of an aspect of the present invention is configured to be an electrostatic capacitance value distribution detecting device for detecting distribution of values of a plurality of electrostatic capacitances that are formed at respective intersections where a plurality of first signal lines intersect a plurality of second signal lines, the electrostatic capacitance value distribution detecting device detecting the distribution by (i) driving the plurality of first signal lines at a first time to output, from the plurality of second signal lines, electric charges corresponding to the plurality of electrostatic capacitances, (ii) switching connection of the plurality of first and second signal lines at a second time after the first time, and (iii) driving the plurality of second signal lines at a third time after the second time to output, from the plurality of first signal lines, electric charges corresponding to the plurality of electrostatic capacitances, the electrostatic capacitance value distribution detecting device including an external noise determining section which determines whether or not external noise exists, the external noise being generated via a touching first indicator and a touching second indicator, along a direction in which the electric charges are outputted, in a case where the number of electrostatic capacitances where signals corresponding to the values exceed a detection threshold is a threshold exceeding electrostatic capacitance number, the external noise determining section detecting the external noise on the basis of (i) a first threshold exceeding electrostatic capacitance number of a first detection region along one of the plurality of first signal lines, (ii) a second threshold exceeding electrostatic capacitance number of a second detection region along one of the plurality of second signal lines, (iii) a third threshold exceeding electrostatic capacitance number of a third detection region along one of the plurality of first signal lines, and (iv) a fourth threshold exceeding electrostatic capacitance number of a fourth detection region along one of the plurality of second signal lines, and the external noise determining section detecting the second threshold exceeding electrostatic capacitance number and the fourth threshold exceeding electrostatic capacitance number at the first time, and detecting the first threshold exceeding electrostatic capacitance number and the third threshold exceeding electrostatic capacitance number at the third time.

According to the configuration, even in a case where a plurality of indicators touch respective regions different from each other, whether or not external noise exists can be correctly determined.

The present invention is not limited to the description of the embodiments above, and can therefore be modified by a skilled person in the art within the scope of the claims. Namely, an embodiment derived from a proper combination of technical means disclosed in different embodiments is encompassed in the technical scope of the present invention.

INDUSTRIAL APPLICABILITY

The present invention is applicable to an electrostatic capacitance value distribution detecting device, a touch panel device, and an electronic device such as a mobile phone.

REFERENCE SIGNS LIST

1: Touch sensor system
2: Electrostatic capacitance value distribution detecting circuit (electrostatic capacitance value distribution detecting device)
3: Touch panel
4: Multiplexer
5: Driving section
6: Sense signal processing section
7: Operation control section (external noise removing or reducing section)
8: Noise detecting section (external noise determining section, phantom noise determining section, notifying section)
9: Touch position detecting section
10: Parameter storing section
11: Connection switching section
100: Mobile phone
109: Display control circuit
110: CPU
111: ROM
112: RAM
113: Camera
114: Microphone
115: Speaker
116: Operation key
118: Display panel
C11 through CMM: Electrostatic capacitance
CL: Control line
DL1 through DLM: Drive line
HL1 through HLM: Horizontal signal line (second signal line)
SL1 through SLM: Sense line
SW1 through SW4: CMOS switch
VL1 through VLM: Vertical signal line (first signal line)
inv: Inverter

The invention claimed is:

1. An electrostatic capacitance value distribution detecting device for detecting distribution of values of a plurality of electrostatic capacitances that are formed at respective intersections where a plurality of first signal lines intersect a plurality of second signal lines, the electrostatic capacitance value distribution detecting device detecting the distribution by (i) driving the plurality of first signal lines at a first time to output, from the plurality of second signal lines, electric charges corresponding to the plurality of electrostatic capacitances, (ii) switching connection of the plurality of first and second signal lines at a second time after the first time, and (iii) driving the plurality of second signal lines at a third time after the second time to output, from the plurality of first signal lines, electric charges corresponding to the plurality of electrostatic capacitances, the electrostatic capacitance value distribution detecting device comprising an external noise determining section which determines whether or not external noise exists, the external noise being generated via a touching indicator along a direction in which the electric charges are outputted, wherein, in a case where the number of electrostatic capacitances where signals corresponding to the values exceed a detection threshold is a threshold exceeding electrostatic capacitance number, the external noise determining section determines whether or not the external noise exists, on the basis of (i) a first threshold exceeding electrostatic capacitance number of a first detection region along one of the plurality of first signal lines and (ii) a second threshold exceeding electrostatic capacitance number of a second detection region along one of the plurality of second signal lines.

2. The electrostatic capacitance value distribution detecting device as set forth in claim 1, wherein
the external noise determining section detects the second threshold exceeding electrostatic capacitance number from signals corresponding to the values which are obtained at the first time, and detects the first threshold exceeding electrostatic capacitance number from signals corresponding to the values which are obtained at the third time.

3. The electrostatic capacitance value distribution detecting device as set forth in claim 1, wherein
the external noise determining section finds, for each of the plurality of second signal lines, as the second threshold exceeding electrostatic capacitance number, from signals corresponding to the values which are obtained at the first time, the number of electrostatic capacitances which exceed the detection threshold,
the external noise determining section finds, as the number of second lines, the number of ones of the plurality of second signal lines each of which ones has the second threshold exceeding electrostatic capacitance number that exceeds a second threshold,
the external noise determining section finds, as a second sum, a sum of second threshold exceeding electrostatic capacitance numbers of the respective ones of the plurality of second signal lines each of which ones has the second threshold exceeding electrostatic capacitance number that exceeds the second threshold,
the external noise determining section finds, for each of the plurality of first signal lines, as the first threshold exceeding electrostatic capacitance number, from signals corresponding to the values which are obtained at the third time, the number of electrostatic capacitances which exceed the detection threshold,
the external noise determining section finds, as the number of first lines, the number of ones of the plurality of first signal lines each of which ones has the first threshold exceeding electrostatic capacitance number that exceeds a first threshold,
the external noise determining section finds, as a first sum, a sum of first threshold exceeding electrostatic capacitance numbers of the respective ones of the plurality of first signal lines each of which ones has the first threshold exceeding electrostatic capacitance number that exceeds the first threshold, and
the external noise determining section determines whether or not the external noise exists, on the basis of the first sum, the second sum, the number of first lines, and the number of second lines.

4. The electrostatic capacitance value distribution detecting device as set forth in claim 3, wherein
the external noise determining section finds, as a noise indicator, a value obtained by subtracting, from a sum of the first sum and the second sum, twice as large as a product of the number of first lines multiplied by the number of second lines, and in a case where the noise indicator is larger than 0, the external noise determining section determines that the external noise has been generated.

5. The electrostatic capacitance value distribution detecting device as set forth in claim 3, wherein the external noise determining section finds, as a noise indicator, a value obtained by subtracting, from a sum of the first sum and the second sum, twice as large as a product of the number of first lines multiplied by the number of second lines, and in a case where the noise indicator is not larger than 0, the external noise determining section determines that the external noise has not been generated.

6. The electrostatic capacitance value distribution detecting device as set forth in claim 1, further comprising an external noise removing or reducing section which removes or reduces the external noise according to a determination result brought by the external noise determining section, and after the external noise removing or reducing section carries out an external noise removing or reducing process, the external noise determining section determining whether or not the external noise exists.

7. The electrostatic capacitance value distribution detecting device as set forth in claim 6, wherein the external noise determining section finds and stores noise quantity of the external noise, and the external noise removing or reducing section removes or reduces the external noise under a condition where the noise quantity stored in the external noise determining section is a minimum noise quantity.

8. The electrostatic capacitance value distribution detecting device as set forth in claim 1, further comprising a notifying section which notifies a host device of a determination result brought by the external noise determining section.

9. The electrostatic capacitance value distribution detecting device as set forth in claim 1, further comprising a phantom noise determining section which determines whether or not phantom noise exists, the phantom noise being generated, due to a touch of an indicator which moves at high speed, along the direction in which the electric charges are outputted.

10. The electrostatic capacitance value distribution detecting device as set forth in claim 9, wherein the electrostatic capacitance value distribution detecting device (i) switches the connection of the plurality of first and second signal lines at a fourth time after the third time, and (ii) drives the plurality of first signal lines at a fifth time after the fourth time to output, from the plurality of second signal lines, the electric charges corresponding to the plurality of electrostatic capacitances, in a case where the number of electrostatic capacitances where signals corresponding to the values exceed a detection threshold is a threshold exceeding electrostatic capacitance number, the external noise determining section determines whether or not the external noise exists, on the basis of (i) a first threshold exceeding electrostatic capacitance number of a first detection region along one of the plurality of first signal lines and (ii) a second threshold exceeding electrostatic capacitance number of a second detection region along one of the plurality of second signal lines, the external noise determining section detects the second threshold exceeding electrostatic capacitance number at the first time, and detects the first threshold exceeding electrostatic capacitance number at the third time, and the phantom noise determining section detects a position, along the plurality of second signal lines, of a peak of signals corresponding to the values which are obtained at the first time, and detects a position, along the plurality of second signal lines, of a peak of signals corresponding to the values which are obtained at the fifth time.

11. The electrostatic capacitance value distribution detecting device as set forth in claim 10, wherein the electrostatic capacitance value distribution detecting device (i) switches the connection of the plurality of first and second signal lines at a sixth time after the fifth time, and (ii) drives the plurality of second signal lines at a seventh time after the sixth time to output, from the plurality of first signal lines, the electric charges corresponding to the plurality of electrostatic capacitances, and the external noise determining section detects the second threshold exceeding electrostatic capacitance number at the fifth time, and detects the first threshold exceeding electrostatic capacitance number at the seventh time.

12. The electrostatic capacitance value distribution detecting device as set forth in claim 11, wherein the external noise determining section determines whether or not the external noise exists, on the basis of (i) a first determination result based on a detection result at the first time and a detection result at the third time, (ii) a second determination result based on the detection result at the third time and a detection result at the fifth time, and (iii) a third determination result based on the detection result at the fifth time and a detection result at the seventh time.

13. The electrostatic capacitance value distribution detecting device as set forth in claim 10, wherein the electrostatic capacitance value distribution detecting device (i) switches the connection of the plurality of first and second signal lines at a sixth time after the fifth time, and (ii) drives the plurality of second signal lines at a seventh time after the sixth time to output, from the plurality of first signal lines, the electric charges corresponding to the plurality of electrostatic capacitances, and the phantom noise determining section determines whether or not the phantom noise exists, on the basis of a first determination result and a second determination result, the first determination result being obtained by detecting (i) the position, along the plurality of second signal lines, of the peak of the signals corresponding to the values which are obtained at the first time and (ii) the position, along the plurality of second signal lines, of the peak of the signals corresponding to the values which are obtained at the fifth time, and the second determination result being obtained by detecting (i) a position, along the plurality of first signal lines, of a peak of signals corresponding to the values which are obtained at the third time and (ii) a position, along the plurality of first signal lines, of a peak of signals corresponding to the values which are obtained at the seventh time.

14. The electrostatic capacitance value distribution detecting device as set forth in claim 13, completing an external noise removing or reducing process according to a determination result brought by the phantom noise determining section.

15. The electrostatic capacitance value distribution detecting device as set forth in claim 9, further comprising a notifying section which notifies a host device of a determination result brought by the phantom noise determining section.

16. A touch panel system, comprising an electrostatic capacitance value distribution detecting device as set forth in claim 1.

17. An electrostatic capacitance value distribution detecting device for detecting distribution of values of a plurality of electrostatic capacitances that are formed at respective intersections where a plurality of first signal lines intersect a plurality of second signal lines, the electrostatic capacitance value distribution detecting device detecting the distribution by (i) driving the plurality of first signal lines at a first time to output, from the plurality of second signal lines, electric charges corresponding to the plurality of electrostatic capacitances, (ii) switching connection of the plurality of first and second signal lines at a second time after the first time, and (iii) driving the plurality of second signal lines at a third time after the second time to output, from the plurality of first signal lines, electric charges corresponding to the plurality of electrostatic capacitances, the electrostatic capacitance value distribution detecting device comprising an external noise determining section which determines whether or not external noise exists, the external noise being generated via a touching first indicator and a touching second indicator along a direction in which the electric charges are outputted, in a case where the number of electrostatic capacitances where signals corresponding to the values exceed a detection threshold is a threshold exceeding electrostatic capacitance number, the external noise determining section detecting the external noise on the basis of (i) a first threshold exceeding electrostatic capacitance number of a first detection region along one of the plurality of first signal lines, (ii) a second threshold exceeding electrostatic capacitance number of a second detection region along one of the plurality of second signal lines, (iii) a third threshold exceeding electrostatic capacitance number of a third detection region along one of the plurality of first signal lines, and (iv) a fourth threshold exceeding electrostatic capacitance number of a fourth detection region along one of the plurality of second signal lines, and the external noise determining section detecting the second threshold exceeding electrostatic capacitance number and the fourth threshold exceeding electrostatic capacitance number at the first time, and detecting the first threshold exceeding electrostatic capacitance number and the third threshold exceeding electrostatic capacitance number at the third time.

18. A touch panel system, comprising an electrostatic capacitance value distribution detecting device as set forth in claim 17.

19. A detection method for an electrostatic capacitance value distribution detecting device which detects distribution of values of a plurality of electrostatic capacitances that are formed at respective intersections where a plurality of first signal lines intersect a plurality of second signal lines, the detection method comprising the steps of:
driving the plurality of first signal lines to output, from the plurality of second signal lines, first electric charges corresponding to the plurality of electrostatic capacitances;
driving the plurality of second signal lines to output, from the plurality of first signal lines, second electric charges corresponding to the plurality of electrostatic capacitances; and
determining, based on the first electric charges and the second electric charges, whether or not external noise exists, the external noise being generated via a touching indicator along a direction in which the first or second electric charges are outputted, wherein, in a case where the number of electrostatic capacitances where signals corresponding to the values exceed a detection threshold is a threshold exceeding electrostatic capacitance number, the determining step determines whether or not the external noise exists, on the basis of (i) a first threshold exceeding electrostatic capacitance number of a first detection region along one of the plurality of first signal lines and (ii) a second threshold exceeding electrostatic capacitance number of a second detection region along one of the plurality of second signal lines.

* * * * *